(12) United States Patent
Gomes et al.

(10) Patent No.: US 11,127,712 B2
(45) Date of Patent: Sep. 21, 2021

(54) FUNCTIONALLY REDUNDANT SEMICONDUCTOR DIES AND PACKAGE

(71) Applicant: Intel Corporation, Santa, CA (US)

(72) Inventors: Wilfred Gomes, Portland, OR (US); Mark T. Bohr, Aloha, OR (US); Udi Sherel, Natanya (IL); Leonard M. Neiberg, Hillsboro, OR (US); Nevine Nassif, Arlington, MA (US); Wesley D. McCullough, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 255 days.

(21) Appl. No.: 15/857,731

(22) Filed: Dec. 29, 2017

(65) Prior Publication Data

US 2019/0206834 A1    Jul. 4, 2019

(51) Int. Cl.
*H01L 25/18* (2006.01)
*H01L 25/065* (2006.01)
*H01L 25/00* (2006.01)

(52) U.S. Cl.
CPC .......... *H01L 25/0652* (2013.01); *H01L 25/18* (2013.01); *H01L 25/50* (2013.01); *H01L 2225/0651* (2013.01); *H01L 2225/06513* (2013.01); *H01L 2225/06517* (2013.01); *H01L 2225/06527* (2013.01)

(58) Field of Classification Search
CPC ...................................... H01L 25/18
See application file for complete search history.

(56) References Cited

U.S. PATENT DOCUMENTS

| | | | |
|---|---|---|---|
| 2005/0251646 A1 | 11/2005 | Klecka et al. | |
| 2007/0164409 A1* | 7/2007 | Holland | H01L 23/552 |
| | | | 257/678 |
| 2009/0015322 A1 | 1/2009 | Flautner et al. | |
| 2012/0147567 A1 | 6/2012 | Lee et al. | |
| 2013/0187292 A1 | 7/2013 | Semmelmeyer et al. | |
| 2014/0268448 A1* | 9/2014 | Tseng | H01L 25/0652 |
| | | | 361/56 |

OTHER PUBLICATIONS

European Search Report from related application EP18209347 dated Jun. 21, 2019.

* cited by examiner

*Primary Examiner* — Douglas M Menz
(74) *Attorney, Agent, or Firm* — Schwabe, Williamson & Wyatt, P.C.

(57) ABSTRACT

Systems and methods of providing redundant functionality in a semiconductor die and package are provided. A three-dimensional electrical mesh network conductively couples smaller semiconductor dies, each including circuitry to provide a first functionality, to a larger base die that includes circuitry to provide a redundant first functionality to the semiconductor die circuitry. The semiconductor die circuitry and the base die circuitry selectively conductively couple to a common conductive structure such that either the semiconductor die circuitry or the base die circuitry is able to provide the first functionality at the conductive structure. Driver circuitry may autonomously or manually, reversibly or irreversibly, cause the semiconductor die circuitry and the base die circuitry couple to the conductive structure. The redundant first functionality circuitry improves the operational flexibility and reliability of the semiconductor die and package.

16 Claims, 8 Drawing Sheets

FUNCTIONALLY REDUNDANT SEMICONDUCTOR DIES AND PACKAGE

TECHNICAL FIELD

The present disclosure relates to semiconductor dies and packaging.

BACKGROUND

Next-generation data centers, Server, Field programmable logic, Artificial intelligence Chips, Graphics processing Units, powerful personal Computers also called Next Gen Data Compute Devices are trending toward systems providing greater computational capabilities, operational flexibility, and improved power efficiency. The combination of demands presented by next-generation data centers and Data Compute units present significant challenges for current general-purpose servers. Increasing demand for reduced system complexity and business agility and scalability has increased demand for virtualized data center infrastructure will place additional demands on next-generation data servers. To meet such varied requirements, next-generation servers may be designed to address a specific workload matrix. However, such task- or service-oriented design, while improving power efficiency, compromises the long term flexibility, yield and design of such next-generation servers. Thus, the servers used in next-generation data centers must be capable of providing a cost effective solution that addresses current and future computational demands, provides a flexible platform capable of meeting evolving operational needs, while delivering improved power efficiency over legacy servers. The challenges presented by the growing ubiquity of Internet-of-Things (IoT) devices are surprisingly similar to those presented by next-generation data centers. With literally billions of connected devices, cloud-based infrastructure must quickly evaluate high-bandwidth data streams and determine which data may be processed and which data may be safely dropped.

Next-generation platforms share several distinct requirements: increased bandwidth; increased flexibility to promote increased functionality; improved power efficiency (or reduced power consumption) and reduced footprint requirements. Heretofore, designers may address such varied demands by packing additional components on a standard printed circuit board. The limitations inherent in such single board solutions may not satisfactorily address the multiple demands placed on next-generation devices. Such limitations include: chip-to-chip bandwidth limitations based on interconnect density; the power demand of long distance traces between chips; and the increased physical size of printed circuit boards to accommodate the chips. Monolithic integration of system components provides a potential solution, however such integration does not readily permit the integration of system components, each of which may evolve at different rates. For example, a logic chip built using a newer technology may not easily integrate or lend itself to monolithic fabrication with a memory chip built using an older technology.

Conventional solutions are therefore unable to meet future demands of higher bandwidth, greater power efficiency, increased functionality, and increased operational flexibility—all in a physically smaller package.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
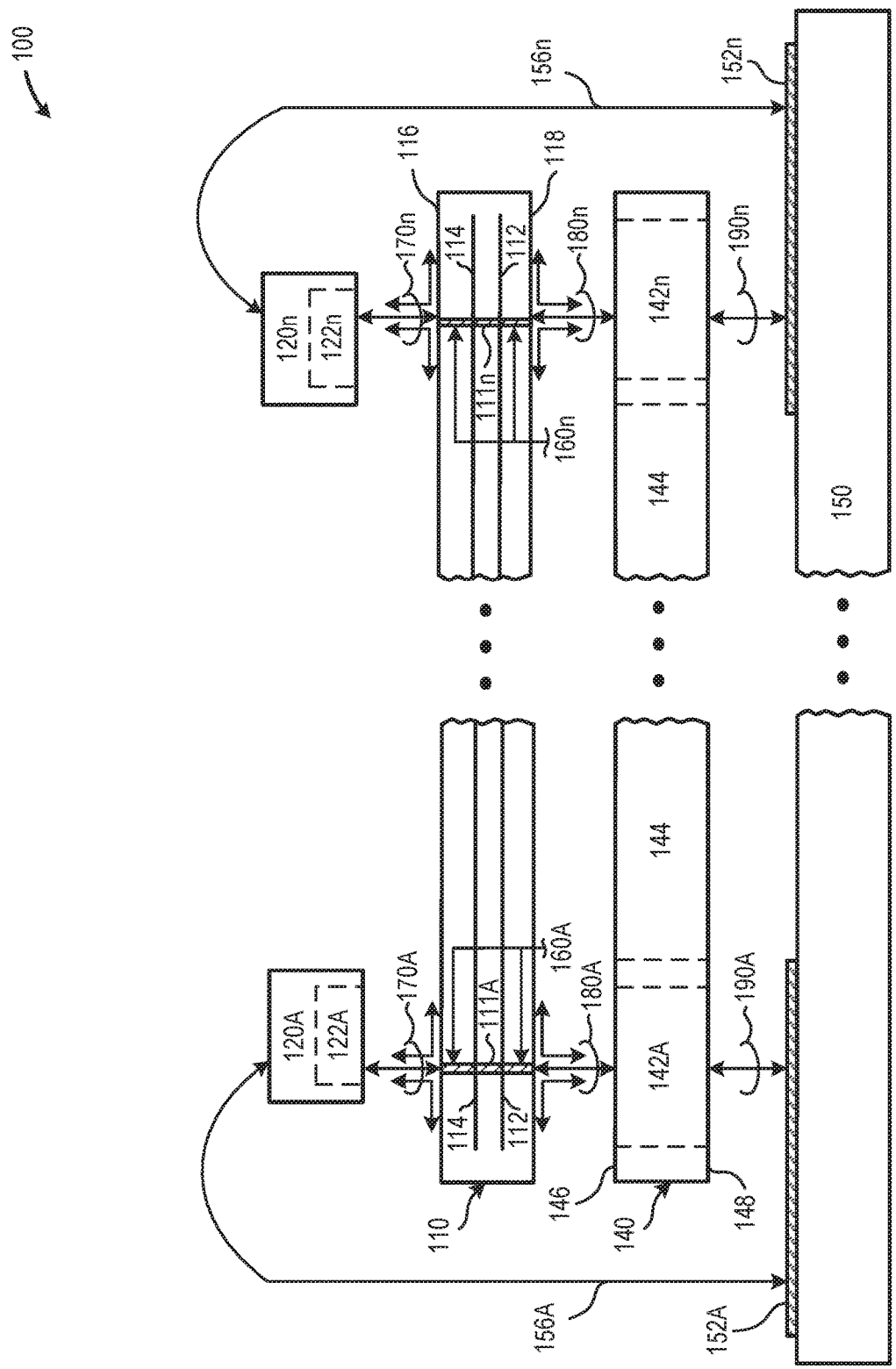
FIG. 1 is a schematic of an illustrative semiconductor package that includes an electrical mesh network that conductively couples each of a plurality of semiconductor dies having circuitry that provides a first functionality to a base die having redundant circuitry that provides the first function, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods described herein include semiconductor packages having an electrical mesh network that physically and conductively couples each of a plurality of relatively physically small semiconductor dies to a single, relatively physically larger, base die. In embodiments, the electrical mesh network may include a multi-layer conductive network in which each of at least some of a first plurality of conductors intersects and/or conductively couples to at least one conductor included in a second plurality of conductors to form an electrical mesh network that includes a plurality of conductive nodes. Each of the relatively small semiconductor dies conductively couples to a network node and includes circuitry that provides a defined functionality. For example, some of the plurality of small semiconductor dies may include input/output circuitry while others may include semiconductor intellectual property core ("IP core") circuitry such as processor core circuitry, graphics processor circuitry, and similar.

The base die also includes circuitry having a defined functionality. For example, the base die may also include I/O circuitry that is functionally similar or identical to the I/O circuitry included in some of the plurality of small semiconductor dies. The I/O circuitry in each of one or more of the plurality of small semiconductor dies may conductively couple, via one or more nodes in the electrical mesh network, to similar I/O circuitry in the base die. Both the I/O circuitry in the small semiconductor die and the I/O circuitry in the base die may be coupled to a common I/O interface contact. Driver circuitry coupled to the node may selectively determine whether the I/O circuitry in the small semiconductor die or the I/O circuitry in the base die is actively coupled to the common I/O interface contact. Such an arrangement beneficially provides a layer of system redundancy in that a failure of one I/O circuit (either the I/O circuitry in the small semiconductor die or the I/O circuitry in the base die) does not compromise the operation of the semiconductor package. Although I/O circuitry is used as an illustrative example, any functionality may be rendered in a redundant manner in one or more small semiconductor dies and in the base die.

The electrical mesh network permits the disposition of the small semiconductor dies in locations closely proximate the base die, shortening the communications links between the small semiconductor dies and the base die. Shorter communications links beneficially improve communication speed while reducing power consumption (e.g., by minimizing power losses) in communicating data between the small semiconductor dies and the base die. The first plurality of conductors and the second plurality of conductors forming the electrical mesh network may be disposed at any angle with respect to each other. At times, the first plurality of conductors and the second plurality of conductors forming the electrical mesh network may be disposed orthogonal (i.e., at a 90° angle) to each other. Each point of intersection between a conductor included in the first plurality of conductors and a conductor included in the second plurality of conductors forms a node in the electrical mesh network.

The operation of the electrical mesh network may be beneficially enhanced by conductively coupling a third plurality of conductors to electrical mesh network nodes that are not directly coupled by the first plurality of conductors or the second plurality of conductors. For example, two conductors included in the first plurality of conductors are parallel and spaced apart from each other. Two conductors included in the second plurality of conductors are disposed parallel and spaced apart from each other. The second plurality of conductors is disposes orthogonal to the first plurality of conductors such that four nodes defining the corners of a square are formed by the resultant electrical mesh network. In such an arrangement, communication between nodes at opposite corners of the square must pass through at least one intervening node. A conductor included in the third plurality of conductors may be disposed on a diagonal in a layer that differs from the layer(s) that include the first plurality of conductors and the second plurality of conductors. The diagonal conductor may conductively couple to the nodes in opposing corners of the square (e.g., using vias), thereby facilitating direct communication between the nodes, improving speed and data integrity while reducing power consumption. Thus, the systems and methods disclosed herein provide functional redundancy in semiconductor packages while delivering improved communications bandwidth and reduced power consumption.

A semiconductor package that includes a three-dimensional, diagonal, electrical mesh network that selectively, conductively, couples semiconductor die circuitry having a first functionality with base die circuitry having the first functionality is provided. The semiconductor package may include: an electrical mesh network that includes: a first plurality of conductors; a second plurality of conductors, each of the second plurality of conductors intersecting at least one of the first plurality of conductors to form a plurality of nodes, each of the nodes at a respective intersection of one of the first plurality of conductors with one of the second plurality of conductors; a base die having an upper surface and a lower surface, the base die including circuitry providing a first functionality conductively coupled to at least one of the plurality of nodes; a plurality of second semiconductor dies, at least one of the plurality of second semiconductor dies including circuitry providing the first functionality; each of the plurality of second semiconductor dies conductively coupled to a respective one of the plurality of nodes; and driver circuitry to selectively conductively couple the electrical mesh network to at least one of the first semiconductor die circuitry providing the first functionality or the at least one second semiconductor die providing the first functionality.

A method of fabricating a semiconductor package that includes a three-dimensional, diagonal, electrical mesh network that selectively, conductively, couples semiconductor die circuitry having a first functionality with base die circuitry having the first functionality is provided. The method may include: forming circuitry providing a first functionality in a base die; forming a first plurality of conductors on a first layer of the base die; forming a second plurality of conductors on the first layer of the base die, where: each of the first plurality of conductors are spaced apart from the remaining first plurality of conductors; each of the second plurality of conductors are spaced apart from the remaining second plurality of conductors; and each of the first plurality of conductors intersects and conductively couples to at least one of the second plurality of conductors to form an electrical mesh network that includes a plurality of nodes, at least a portion of the plurality of nodes conductively coupled the base die circuitry providing the first functionality; conductively coupling at least one semiconductor die to a respective one of the portion of the plurality of nodes coupled to the first plurality of conductors and to the second plurality of conductors, the at least one semiconductor die including circuitry providing the first functionality; and conductively coupling driver circuitry to the respective one of the portion of the plurality of nodes coupled to the first plurality of conductors and to the second plurality of conductors, the driver circuitry to selectively conductively couple at least the base die circuitry providing the first functionality or the semiconductor die circuitry providing the first functionality to the electrical mesh network.

A processor-based electronic device that includes a semiconductor package that includes a three-dimensional, diagonal, electrical mesh network that selectively, conductively, couples semiconductor die circuitry having a first functionality with base die circuitry having the first functionality is provided. The device may include: a printed circuit board; and a semiconductor package conductively coupled to the printed circuit board, the semiconductor package including: an electrical mesh network that includes: a first plurality of conductors; a second plurality of conductors, each of the second plurality of conductors intersecting at least one of the first plurality of conductors to form a plurality of nodes, each of the plurality of nodes at a respective intersection of one of the first plurality of conductors with one of the second plurality of conductors; a base die having an upper surface and a lower surface, the base die including circuitry providing a first functionality conductively coupled to at least one of the plurality of nodes; a plurality of semiconductor dies, at least one of the plurality of semiconductor dies including circuitry providing the first functionality; each of the plurality of semiconductor dies conductively coupled to a respective one of the plurality of nodes; and driver circuitry to selectively conductively couple the electrical mesh network to at least one of the first semiconductor die circuitry providing the first functionality or the at least one second semiconductor die providing the first functionality.

A semiconductor package system that includes a three-dimensional, diagonal, electrical mesh network that selectively, conductively, couples semiconductor die circuitry having a first functionality with base die circuitry having the first functionality is provided. The system may include: means for forming circuitry providing a first functionality in a base die; means for forming a first plurality of conductors on a first layer of the base die; means for forming a second plurality of conductors on the first layer of the base die, where: each of the first plurality of conductors are spaced apart from the remaining first plurality of conductors; each of the second plurality of conductors are spaced apart from the remaining second plurality of conductors; and each of the first plurality of conductors intersects and conductively couples to at least one of the second plurality of conductors to form an electrical mesh network that includes a plurality of nodes, at least a portion of the plurality of nodes conductively coupled the base die circuitry providing the first functionality; means for conductively coupling at least one semiconductor die to a respective one of the portion of the plurality of nodes coupled to the first plurality of conductors and to the second plurality of conductors, the at least one semiconductor die including circuitry providing the first functionality; and means for conductively coupling driver circuitry to the respective one of the portion of the plurality of nodes coupled to the first plurality of conductors and to the second plurality of conductors, the driver circuitry to selectively conductively couple at least the base die circuitry providing the first functionality or the semiconductor die circuitry providing the first functionality to the electrical mesh network.

As used herein the terms "top," "bottom," "upper," "lower," "lowermost," and "uppermost" when used in relationship to one or more elements are intended to convey a relative rather than absolute physical configuration. Thus, an element described as an "upper film layer" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

FIG. 1 is a schematic of an illustrative semiconductor package 100 that includes an electrical mesh network 110 that conductively couples 170A-170n each of a plurality of semiconductor dies 120A-120n having circuitry 122A-122n that provides a first functionality to a base die 140 having redundant circuitry 142A-142n that provides the first function, in accordance with at least one embodiment described herein. In embodiments, the electrical mesh network 110 may also couple a plurality of semiconductor IP cores 130A-130n (collectively, "IP cores 130") to support circuitry 144 included in the base die 140. In even further embodiments, the electrical mesh network 110 may include first electrical mesh network 112 in which conductors 310A-310n included in a first plurality of conductors 310 intersect conductors 320A-320n included in a second plurality of conductors 320. The points at which the first plurality of conductors 310 intersect or are electrically conductively coupled to the second plurality of conductors 320 define a plurality of nodes included in the electrical mesh network 110. The electrical mesh network 110 may also include a diagonal electrical mesh network 114 that conductively couples to selected nodes in the electrical mesh network 110. The base die 140 conductively couples to each of a plurality of conductive structures 152A-152n (collectively, "conductive structure 152") disposed in, on, about, or across at least a portion of an upper surface of a semiconductor package substrate 150.

Each of the plurality of semiconductor dies 120A-120n includes respective circuitry 122A-122n (collectively, "circuitry 122") having a defined first functionality. For example, at least some of the semiconductor dies 120 contain circuitry 122 having peripheral component interconnect express (PCIe) functionality. The base die 140 also includes circuitry 142 having the first functionality. For example, the base die 140 includes circuitry 142 having PCIe functionality. The semiconductor die circuitry 122A having the defined first functionality and the base die circuitry 142A having the first defined functionality conductively couple to a respective common conductive structure 152A that is disposed in, on, or about a substrate 150.

Driver circuitry 160A-160n (collectively, "driver circuitry 160") conductively couples to the electrical mesh network 110 and/or one or more conductive structures 111A-111n (collectively, "conductive structures 111"). The driver circuitry 160 may selectively couple either the semiconductor die circuitry 122 or the base die circuitry 142 to the electrical mesh network 110, responsive to receipt of either an autonomously generated signal (e.g., a signal indicative of a failure of the semiconductor die 120) or a manually generated signal (e.g., a user command to couple I/O circuitry in the base die 140 rather than I/O circuitry in the semiconductor die 120). In embodiments, while the first functionality of the I/O circuitry 122 in the semiconductor die 120 and the I/O circuitry 142 in the base die 140 may be similar or identical, one or more operating parameters may differ between I/O circuitry 122 and I/O circuitry 142. For example, I/O circuitry 122 in the semiconductor die 120 may have a higher current limit than I/O circuitry 142 in the base die 140. In another example, the I/O bandwidth of the I/O circuitry 122 in the semiconductor die 120 and the I/O circuitry 142 in the base die 140 may differ. In this manner, the base die circuitry 142 beneficially provides redundancy for the semiconductor die circuitry 122, and vice-versa. Thus, a failure of either the base die circuitry 142 or the semiconductor die circuitry 122 does not compromise the operational integrity and/or capabilities of the semiconductor package 100. In embodiments, the driver circuitry 160 may be driven by the support circuitry 144 in the base die 140.

The electrical mesh network 110 may include a network deposited, formed, patterned, or otherwise disposed in, on, about, or around one or more layers included in the base die 140. The electrical mesh network 110 includes a first plurality of conductors and a second plurality of conductors disposed at an angle to the first plurality of conductors such that at least one of the second plurality of conductors intersects at least one of the first plurality of conductors. In some embodiments, the electrical mesh network 110 may include a first plurality of conductors disposed parallel to each other across all or a portion of the upper surface 146 of the base die 140 and a second plurality of conductors disposed parallel to each other and orthogonal to each of the first plurality of conductors. In such an embodiment, the first plurality of conductors and the second plurality of conductors form an orthogonal electrical mesh network 112 portion of the electrical mesh network 110.

Each intersection point where one of the second plurality of conductors contacts one of the first plurality of conductors defines one of a plurality of nodes on the electrical mesh network 110. In embodiments, each of the plurality of semiconductor dies 120 and each of the IP cores 130 may be conductively coupled to a respective electrical mesh network node. In embodiments, the electrical mesh network 110 may be deposited, patterned, formed, or otherwise disposed on, across, or about at least a portion of the upper surface 146 of the base die 140 using any currently available or future developed material deposition process or method. In some implementations, the electrical mesh network 110 may be formed on a single layer across all or a portion of the base die 130—i.e., the first plurality of conductors and the second plurality of conductors may be formed on the same layer (e.g., the same metal layer) of the base die 130. In some implementations, the electrical mesh network 110 may be formed in multiple layers across all or a portion of the base die 130—i.e., each of the first plurality of conductors and/or each of the second plurality of conductors may be formed on two or more different layers (e.g., adjacent or non-adjacent metal layers) of the base die 130.

The electrical mesh network 110 may include a third plurality of conductors. In embodiments, the conductors forming the third plurality of conductors may be disposed at an angle of less than about 90° measured with respect to the first plurality of conductors and the second plurality of conductors. In embodiments, the first plurality of conductors and the second plurality of conductors may be disposed at 90° angles with respect to each other to provide the orthogonal electrical mesh network 112. In such embodiments, the conductors forming the third plurality of conductors may be disposed diagonally with respect to the first plurality of conductors and the second plurality of conductors to provide diagonal electrical mesh network 114. In embodiments, each of the conductors included in the diagonal mesh network 114 may be conductively coupled to non-adjacent nodes (i.e., nodes not directly connected by either or both the first plurality of conductors or the second plurality of conductors). In some embodiments, the third plurality of conductors may be formed on a second layer that is different than the first layer that includes the first plurality of conductors and the second plurality of conductors. In such instances, the third plurality of conductors may conductively couple to the node using the plurality of conductive structures 111. The presence of the diagonal electrical mesh network 114 beneficially directly couples nodes that would otherwise not be directly connected. As such, the diagonal electrical mesh network 114 provides a pathway for signals between nodes to bypass intervening nodes, increasing communication bandwidth and reducing power consumption.

The electrical mesh network 110, including the first plurality of conductors and the second plurality of conductors may be deposited, formed, patterned, or otherwise disposed proximate a first layer of the base die 140. In embodiments, the first layer containing the first plurality of conductors and the second plurality of conductors may include all or a portion of the upper surface 146 of the base die 140. The third plurality of conductors may be deposited, formed, patterned, or otherwise disposed proximate a second layer of the base die 140. The second layer containing the third plurality of conductors may be electrically isolated from the first layer containing the first plurality of conductors and/or the second plurality of conductors. In such embodiments, one or more conductive structures 111 may conductively couple the third plurality of conductors to a respective node of the electrical mesh network formed by the first plurality of conductors and the second plurality of conductors.

In embodiments, either of the first electrical mesh network 112 or the diagonal electrical mesh network 114 may be deposited, formed, patterned, or otherwise disposed as a single metal layer on the upper surface 146 of the base die 140 and the other electrical mesh network may be deposited, formed, patterned, or otherwise disposed on a second layer. The second layer may be electrically isolated from the upper surface 146 of the base die 140. The electrical mesh network 110 may be formed using any currently available or future developed material deposition and/or patterning process or method. Non-limiting examples of material deposition and/or patterning processes include, but are not limited to, photolithography, printing, electroplating, electro-less plating, chemical vapor deposition, atomic layer deposition, physical layer deposition, and similar. As depicted in FIG. 1, the I/O circuitry 142 and the support circuitry 144 disposed in the base die 140 bidirectionally communicably couples 180 to the electrical mesh network 110 using conductors such as metal traces, vias, and similar that are disposed in, on, or about the base die 140. Also as depicted in FIG. 1, the I/O circuitry and the support circuitry 144 in the base die 140 conductively couples to the substrate 150, for example using one or more conductive structures such as microbumps, solder balls, flexible contacts, or similar. Also as depicted in FIG. 1, the IP cores 130A-130n may conductively couple 172A-172n to the support circuitry 144 disposed in the base die 140. In embodiments, one or more conductive structures may conductively couple each of the IP cores 130 to the support circuitry 144 in the base die 140.

A plurality of conductive features may be deposited, patterned, formed, or otherwise disposed in, on, about, or across at least a portion of the lower surface 148 of the base die 140. The plurality of conductive features 148 conductively couple 190 the base die 140 (and the semiconductor package 100) to a substrate 150. The substrate 150 may include a printed circuit board, motherboard, daughterboard, server blade, or similar. Conductors, such as metal traces, vias, etc., conductively couple the conductive features on the lower surface 148 of the base die 140 to the I/O circuitry 142, the support circuitry 144, and/or the electrical mesh network 110.

The plurality of semiconductor dies 120 may include any number and/or combination of circuitry 122 that provides at least the first functionality. The circuitry 122 in each of the semiconductor dies 120 may include any number and/or combination of electrical components, semiconductor devices, and/or logic elements needed to provide the first functionality. The first functionality may include, but is not limited to, one or more of: communication, input/output, and/or memory. In the embodiment depicted in FIG. 1, each of the semiconductor dies 120 includes input/output circuitry 122. The semiconductor dies 120 conductively couple, via one or more conductive structures 111, to a respective node of the electrical mesh network 110. The electrical mesh network 110, in turn, conductively couples to the base die 140. In embodiments the electrical mesh network 110 may conductively couple, via one or more conductive structures 111, to support circuitry 144 disposed in, on, about, or across the base die 140. In embodiments, the electrical mesh network 110 may conductively couple, via one or more conductive structures 111 to redundant circuitry 142 in the base die 140 that provides at least the first functionality.

Each of the semiconductor dies 120 has a lower surface disposed proximate the electrical mesh network 110. In embodiments, the machine executable instruction sets that cause the operation of the I/O circuitry 142 and/or the support circuitry 144 in the base die 140 may be executed in whole or in part by processor circuitry and/or controller circuitry disposed in, on, or about the semiconductor dies 120. In embodiments, each of the semiconductor dies 120 may occupy the same area on the electrical mesh network 110 and/or the upper surface 146 of the base die 140. In embodiments, the semiconductor dies 120 may occupy different areas on the electrical mesh network 110 and/or the upper surface 142 of the base die 140. The may have a surface area of less than: about 25 square millimeters ($mm^2$); about 20 $mm^2$; about 15 $mm^2$; about 12 $mm^2$; about 10 $mm^2$; about 8 $mm^2$; or about 5 $mm^2$.

Each of the semiconductor dies 120 includes one or more conductive fixtures disposed in, on, about, or across at least a portion of the lower surface of the semiconductor die 120. The one or more conductive fixtures may be disposed in a fixed pattern or arrangement in, on, about or across the lower surface of each of the semiconductor dies 120. Maintaining the conductive features in a fixed pattern or arrangement on the lower surface of the semiconductor die 120 beneficially permits the replacement and/or substitution of semiconductor dies 120 without requiring a redesign of the base die 140. For example, a newer semiconductor die $120_{NEW}$ may selectively replace an older semiconductor die $120_{OLD}$ in a particular semiconductor package 100. Such replacement is greatly facilitated and redesign time and costs reduced or even eliminated when the arrangement of the conductive features on the older semiconductor die $120_{OLD}$ match the arrangement of the conductive features found on the newer semiconductor die $120_{NEW}$. Since semiconductor dies 120 may be readily substituted without requiring a complete rework of the base die 140, time-to-market is advantageously reduced and market responsiveness beneficially improved.

In embodiments, each of the semiconductor die intellectual property cores 130 (collectively, "IP cores 130") may be conductively coupled to a respective node on the electrical mesh network 110. Each of the IP cores 130 may include, but is not limited to, a reusable unit of logic, cell, or integrated circuit/chip/chiplet layout design. Example IP cores 130 include, but are not limited to, universal asynchronous receiver/transmitter (UARTs); central processing units (CPUs); graphics processing units (GPUs); IEEE 802.11 Ethernet controllers; Peripheral Component Interconnect (PCI) interfaces; storage devices; and similar. Each of the IP cores 130 includes circuitry (e.g., processor core circuitry) disposed on a physically relatively small (compared to the base die 140) integrated circuit. Each of the IP cores 130 has a lower surface that is disposed proximate the electrical mesh network 110 and/or the base die 140. In embodiments, the machine executable instruction sets that cause the operation of the circuitry 144 in the base die 140 may be executed in whole or in part by processor circuitry and/or controller circuitry disposed in, on, or about the IP cores 130. In embodiments, each of the IP cores 130 may occupy the same area on the upper surface 146 of the base die 140. In embodiments, the IP cores 130 may occupy different areas on the upper surface 146 of the base die 140. the may have a surface area of less than: about 25 square millimeters ($mm^2$); about 20 $mm^2$; about 15 $mm^2$; about 12 $mm^2$; about 10 $mm^2$; about 8 $mm^2$; or about 5 $mm^2$.

Each of the IP cores 130 includes one or more conductive fixtures disposed in, on, about, or across at least a portion of the lower surface of the IP core 130. The one or more conductive fixtures may be disposed in a fixed pattern or arrangement in, on, about or across the lower surface of each of the IP cores 130. Maintaining the conductive features in a fixed pattern or arrangement beneficially permits the replacement and/or substitution of IP cores 130 without requiring a redesign of the base die 140. For example, a newer IP core $130_{NEW}$ may selectively replace an older IP core $130_{OLD}$ in a particular semiconductor package design. Such replacement is greatly facilitated and redesign time and costs reduced or even eliminated when the arrangement of the conductive features on the older IP core $130_{OLD}$ match the arrangement of the conductive features found on the newer IP core $130_{NEW}$. Since IP cores 130 may be readily substituted without requiring a complete rework of the base die 140, time-to-market is advantageously reduced and market responsiveness beneficially improved.

The base die 140 communicably couples 190 to a substrate 150. The substrate 150 may include a multi-layer printed circuit board or similar. In embodiments, the electrical mesh network 110 includes a number of interconnected conductive pathways or members that couple each of the semiconductor dies 120 and IP cores 130 to one or more neighboring semiconductor dies 120 and/or IP cores 130. The electrical mesh network 110 thus facilitates communication between the semiconductor dies 120 and IP cores 130. In embodiments the interconnected conductive pathways or members forming the electrical mesh network 110 also conductively couple each of the semiconductor dies 120 and IP cores 130 to the base die 140 facilitating communication between the semiconductor dies 120 and IP cores 130 and the support circuitry 144 in the base die 140.

The base die 140 includes circuitry 142A-142n capable of providing a first functionality that is similar or identical to the first functionality provided by the circuitry 122A-122n in semiconductor dies 120A-120n. In addition, the base die 140 may include support circuitry 144 that supports the operation of at least some of the plurality of semiconductor dies 120 and/or the IP cores 130. The support circuitry 144 may include, but is not limited to, one or more of the following: data storage circuitry; cache circuitry; input/output circuitry; processor voltage regulation circuitry (e.g., fully integrated voltage regulator or "FIVR" circuitry); communications interface circuitry; bus interface circuitry; and combinations thereof.

Physically, the base die 140 is relatively larger than each of either the semiconductor dies 120 and the IP cores 120. In embodiments, the base die 140 may have an upper surface area of less than: about 3000 square millimeters (mm²); about 2500 mm²; about 2000 mm²; about 1500 mm²; about 1000 mm²; about 700 mm²; or about 500 mm². As depicted in FIG. 1, in embodiments, all or a portion of the peripheral regions of the base die 140 may include I/O circuitry 142 having a first functionality that duplicates at least a portion of the first functionality of the circuitry 122 in the semiconductor dies 120.

In embodiments, all or a portion of the central region of the base die 140 bounded by the peripheral regions may include support circuitry 144, such as IP core voltage regulation circuitry and IP core cache circuitry. In such embodiments, the IP cores 130 may be coupled to the electrical mesh network 110 and/or base die 140 in the central region of the base die 140 that includes the voltage regulation and/or cache circuitry. Disposing the IP cores 130 proximate the support circuitry 144 in the base die 140 beneficially reduces cache access time, thereby improving the performance of the semiconductor package 100.

Figure 2:
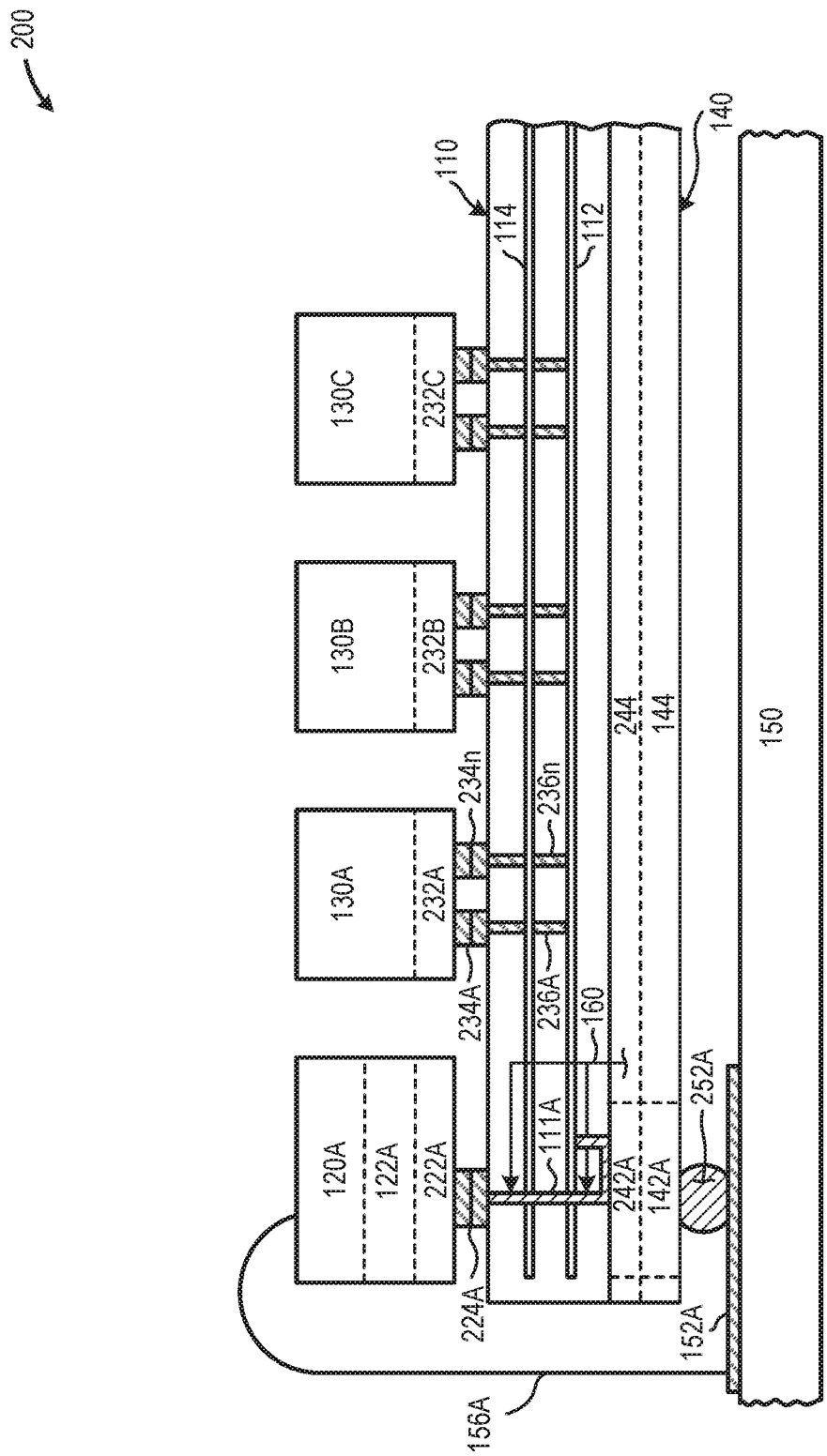
FIG. 2 is a partial cross-sectional elevation of an illustrative semiconductor package that includes an electrical mesh network that includes a first electrical mesh network and a diagonal electrical mesh network that communicably couples a plurality of semiconductor dies that include I/O circuitry and IP cores to a base die, in accordance with at least one embodiment described herein.

FIG. 2 is a partial cross-sectional elevation of an illustrative semiconductor package 200 that includes an electrical mesh network 110 that includes a first electrical mesh network 112 and a diagonal electrical mesh network 114 that communicably couples a plurality of semiconductor dies 120 that include I/O circuitry 120 and IP cores 130A-130C to a base die 140, in accordance with at least one embodiment described herein. As depicted in FIG. 2, driver circuitry 160 may provide an output that determines whether the circuitry 122A in semiconductor die 120A or circuitry 142A in the base die 140 is actively coupled to the contact pad 152 disposed on the substrate 150. In embodiments, a conductive member 156A, such as a wirebond, conductively couples the circuitry 122A in the semiconductor die 120A. In embodiments, a conductive structure 220A conductively couples the circuitry 142A in the base die 140 to the contact pad disposed on the substrate 152.

As depicted in FIG. 2 active components, including active semiconductor components such as transistors, may be formed or otherwise disposed in a lower portion 222A-222n (collectively, "lower portion 222") of each of the respective semiconductor dies 120A-120n. Similarly, active components, including active semiconductor components such as transistors, may be formed or otherwise disposed in a lower portion 232A-232n (collectively, "lower portion 232") of each of the respective IP cores 130A-130n. Disposing the active components in the lower portion 222 of each of the semiconductor dies 120 and in the lower portion 232 of each of the IP cores 130 and reduces the physical separation between the circuitry containing the respective semiconductor components and the electrical mesh network 110, beneficially improving performance while reducing power losses.

Active components, including active semiconductor components such as transistors, may be formed or otherwise disposed in an upper portion 242A of the circuitry 142A portion of the base die 140 and/or in an upper portion 244 of the support circuitry 144 portion of the base die 140. In at least some embodiments, at least some of the semiconductor components disposed in an upper portion 242A of the circuitry 142A portion of the base die 140 may form all or a portion of the I/O circuitry coupled to the semiconductor die 120A via the electrical mesh network 110. In such embodiments, disposing semiconductor components in the upper portion 242A of the circuitry portion 142A of the base die 130 reduces the physical separation between the circuitry 142A and the electrical mesh network 110, further improving performance while reducing power losses.

As depicted in FIG. 2, one or more conductive structures 111A conductively couples to the circuitry 122A providing the first functionality in the semiconductor die 120A and to the circuitry 142A providing the first functionality in the base die 140. Driver circuitry 160 selectively conductively couples either or both the base die circuitry 142A and/or the semiconductor die circuitry 122A to electrical mesh network 110. In embodiments, a portion of the support circuitry 144 in the base die 140 may provide the driver circuitry 160. In other embodiments, one or more devices or systems external to the semiconductor package 200 may provide all or a portion of the driver circuitry 160.

One or more conductive structures 224A-224n (collectively, "conductive structures 224"), such as one or more micro-bumps, solder bumps, solder balls, or similar conductively couple each of the semiconductor dies 120A-120n to the electrical mesh network 110 and/or the upper surface 146 of the base die 140. In embodiments, the one or more conductive structures 224 may include a plurality of micro-bumps arranged on a fine pitch array disposed in, on, about, or across all or a portion of the lower surface of the semiconductor dies 120. For example, the conductive structures 224 may include micro-bumps formed from copper (Cu), copper containing alloys, silver (Ag), silver containing alloys, nickel (Ni), nickel containing alloys, and combinations thereof. In embodiments, the conductive structures 224 may include micro-bumps having a diameter of less than: about 50 micrometers (μm); about 40 μm; about 30 μm; about 25 μm; about 15 μm; or about 10 μm. In embodiments, the conductive structures 250 may disposed on a pitch of less than: about 70 micrometers (μm); about 60 μm; about 50 μm; about 40 μm; about 30 μm, or about 20 μm. In some implementations, a fine layer of solder similar electrically conductive material capable of reflow may be disposed proximate the conductive structures 224 disposed on the lower surface of the semiconductor dies 120.

One or more conductive structures 234A-234n (collectively, "conductive structures 234"), such as one or more micro-bumps, solder bumps, solder balls, or similar conductively couple each of the IP cores 130A-130n to the electrical mesh network 110 and/or the upper surface 146 of the base die 140. In embodiments, the one or more conductive structures 234 may include a plurality of micro-bumps arranged on a fine pitch array across all or a portion of the lower surface of the IP core 130. For example, the conductive structures 234 may include micro-bumps formed from copper (Cu), copper containing alloys, silver (Ag), silver containing alloys, nickel (Ni), nickel containing alloys, and combinations thereof. In embodiments, the conductive structures 234 may include micro-bumps having a diameter of less than: about 50 micrometers (µm); about 40 µm; about 30 µm; about 25 µm; about 15 µm; or about 10 µm. In embodiments, the conductive structures 250 may disposed on a pitch of less than: about 70 micrometers (µm); about 60 µm; about 50 µm; about 40 µm; about 30 µm, or about 20 µm. In some implementations, a fine layer of solder similar electrically conductive material capable of reflow may be disposed proximate the conductive structures 234 disposed on the lower surface of the IP cores 130.

Figure 3A:
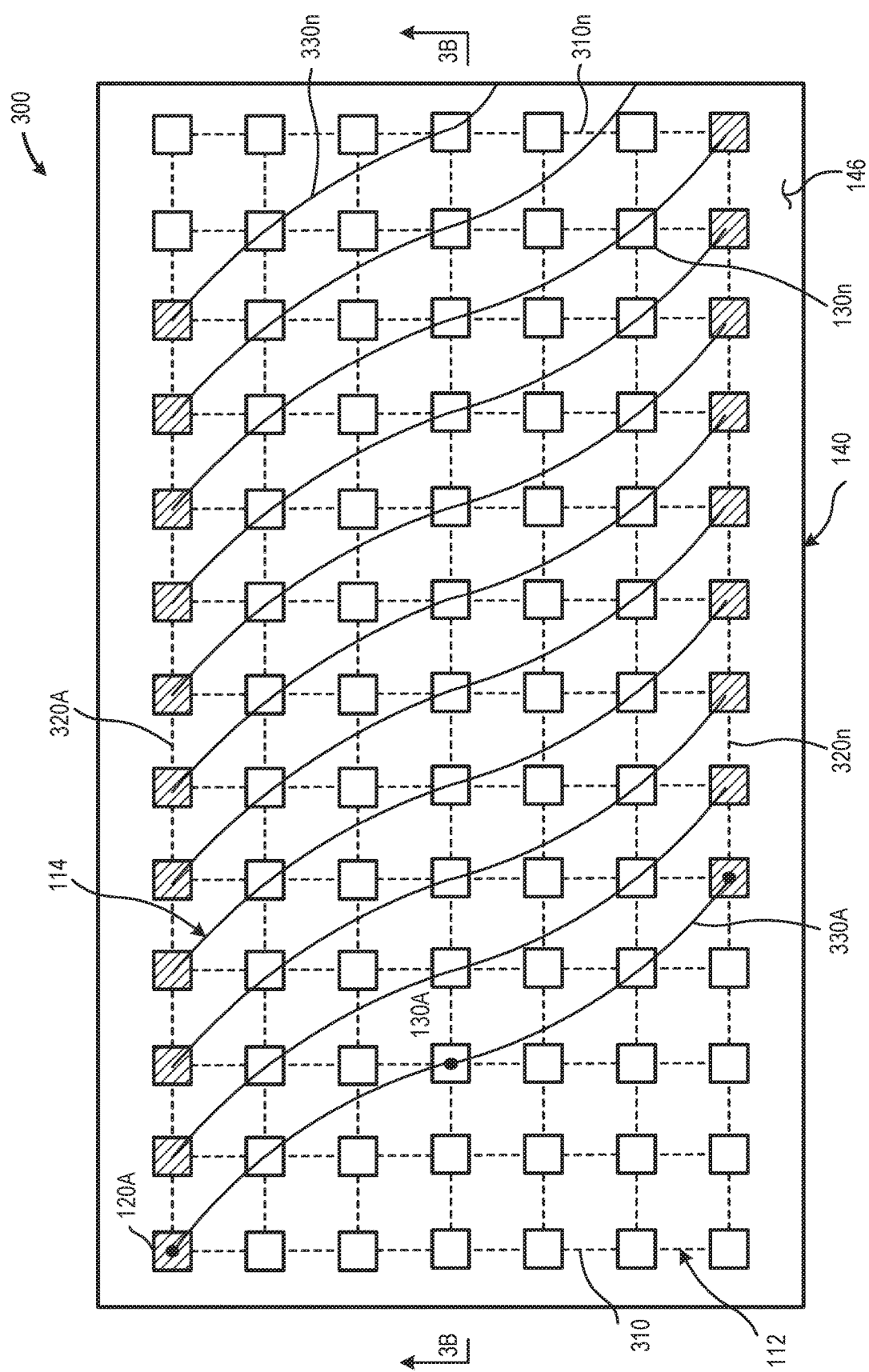
FIG. 3A is a plan view of an illustrative semiconductor package that includes a first plurality of conductors and a second plurality of conductors disposed orthogonally to the first conductors to form an orthogonal electrical mesh network and a third plurality of conductors disposed diagonally with respect to the orthogonal mesh network to form a diagonal electrical mesh network, in accordance with at least one embodiment described herein.
Figure 3B:
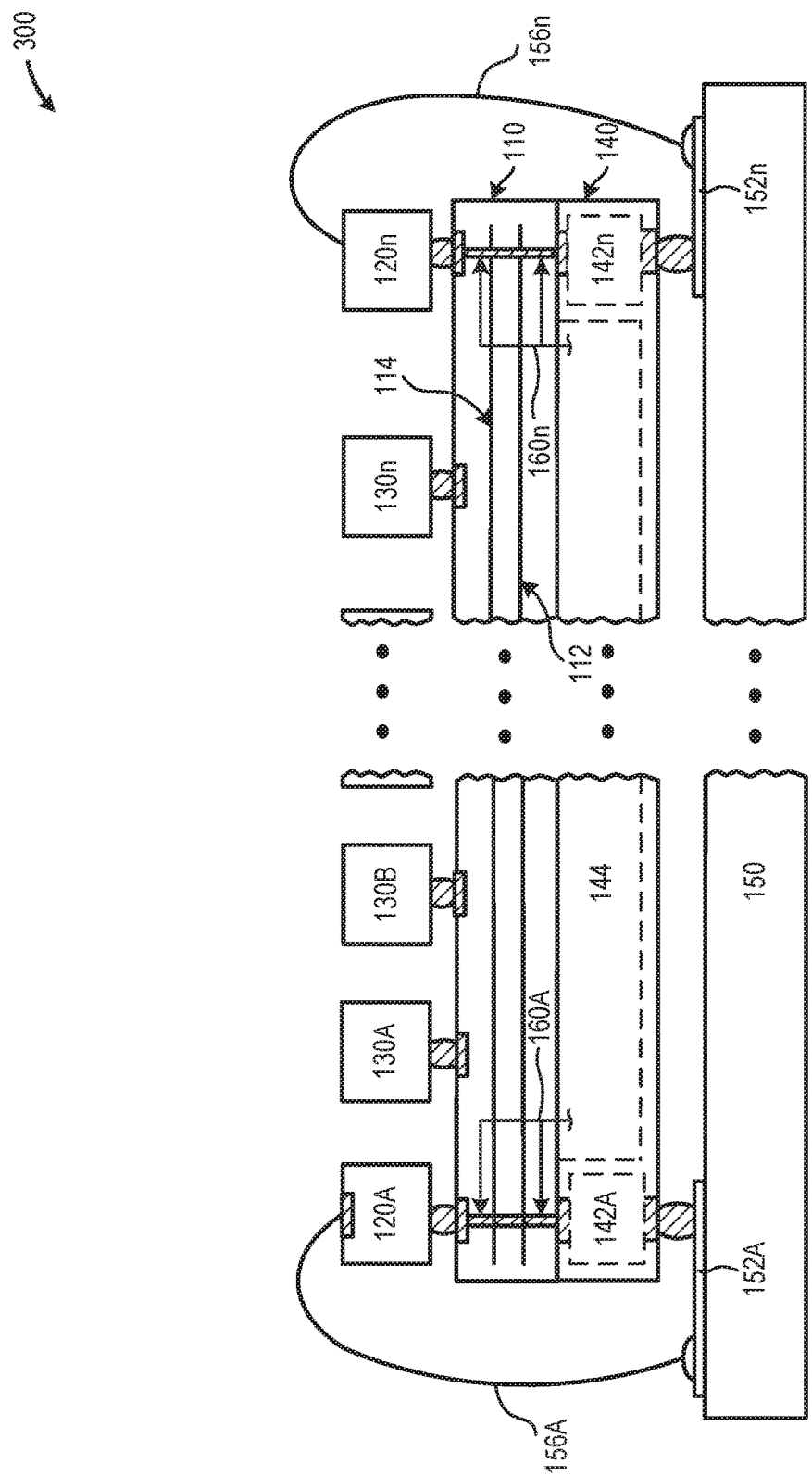
FIG. 3B is a cross-sectional elevation of the illustrative semiconductor package depicted in FIG. 3A along section line 3B-3B, in accordance with at least one embodiment described herein.

FIG. 3A is a plan view of an illustrative semiconductor package 300 that includes an electrical mesh network 110 that includes a first plurality of conductors 310A-310n (collectively "first conductors 310"), a second plurality of conductors 320A-320n (collectively, "second conductors 320") disposed orthogonally to the first conductors 310 to form an orthogonal electrical mesh network 112 and a third plurality of conductors 330A-330n (collectively, "third conductors 330") disposed diagonally with respect to the first plurality of conductors 310 and the second plurality of conductors 320 to form a diagonal electrical mesh network 114, in accordance with at least one embodiment described herein. FIG. 3B is a cross-sectional elevation of the illustrative semiconductor package depicted in FIG. 3A along section line 3B-3B, in accordance with at least one embodiment described herein. As depicted in FIGS. 3A and 3B, the orthogonal electrical mesh network 112 and the diagonal electrical mesh network 114 conductively and physically couples the semiconductor dies 120 and the IP cores 130 to a base die 140 that includes base die circuitry 142A-142n and support circuitry 144. As depicted in FIG. 3A, each of the first plurality of conductors 310 may be disposed orthogonal to (i.e., at a 90° angle with respect to) each of the second plurality of conductors 320. Also as depicted in FIG. 3A, each of the third plurality of conductors 330 may be disposed at an angle of less than 90° with respect to each of the first plurality of conductors 310 and with respect to each of the second plurality of conductors 320.

In FIG. 3A, the electrical mesh network 110 includes an orthogonal electrical mesh network 112 and a diagonal electrical mesh network 114. The conductors forming the orthogonal electrical mesh network 112 are deposited, formed, patterned or otherwise disposed on a first layer of the base die 140, and are depicted as dashed lines in FIG. 3A. The conductors forming the diagonal electrical mesh network 114 are deposited, formed, or otherwise disposed on a second layer of the base die 140, and are depicted as solid lines in FIG. 3A. A plurality of conductive structures that conductively couple the diagonal electrical mesh network 114 to the orthogonal electrical mesh network 112 may be formed in all or a portion of the base layer 140.

Each of the semiconductor dies 120A-120n may include any number and/or combination of electrical circuits 122A-122n. In embodiments, each of the semiconductor dies 120A-120n may have the same or different circuitry 122A-122n. In embodiments, at least some of the semiconductor dies 120A-120n may include circuitry 122A-122n that provides a first functionality. In embodiments, at least some of the semiconductor dies 120 may include input/output circuitry 122 that provides a first functionality that includes an input/output (I/O) functionality. As depicted in FIG. 3A, diagonal conductor 330A directly (i.e., without passing through any intervening semiconductor dies 120 and/or IP cores 130) conductively couples to IP core 130A that, in turn, directly conductively couples to semiconductor die 120B. As evidenced in FIG. 3A, the diagonal conductor 310A reduces the number of intervening semiconductor dies 120 and/or IP cores 130 (from 4 intervening devices to 0 intervening devices) through which a signal must pass between semiconductor die 120A and IP core 130A. Reducing the number of intervening devices beneficially improves bandwidth and reduces power consumption associated with data transmission between the semiconductor die 120A and the IP core 130A. Each of the IP cores 130 may include any number of circuits or circuitry. As depicted in FIG. 3A, each of the IP cores 130A-130n may include one or more processor core circuits, graphics processor circuits, field programmable gate array circuits, memory circuits, or combinations thereof.

The base die 140 includes a plurality of circuits 142 capable of providing the first functionality and any number of support circuits 144. In embodiments, the base die 140 may include a region containing memory circuitry, such as cache circuitry. In such embodiments, the IP cores 130 may be positioned proximate the region of the base die 140 that includes the cache memory circuitry and/or processor voltage regulation circuitry. Positioning the IP cores 130 proximate the memory circuitry beneficially improves cache access times while reducing power consumption.

A number of support circuits 144 may be deposited, formed, patterned, or otherwise disposed in, on, across, or about the periphery of the base die 140. The support circuits 144 may include I/O circuitry, data storage circuitry, voltage regulation circuitry, or combinations thereof deposited, formed, patterned, or otherwise disposed in, on, across, or about the base die 140. In embodiments, circuitry 142 capable of providing the first functionality may be deposited, formed, patterned, or otherwise disposed in, on, about, or across at least a portion of a peripheral region of the base die 140. The data storage circuitry may include any currently available or future developed data storage technology. Such data storage circuitry may include, but is not limited to, electrostatic data storage circuits; quantum data storage circuits; molecular data storage circuits; electroresistive data storage circuits; optical data storage circuits; or combinations thereof.

The first plurality of conductors 310 includes conductors 310A-310n deposited, formed, patterned, or otherwise disposed in, on, about, or across at least a portion of the upper surface 146 of the base die 140. In embodiments, the conductors 310A-310n included in the first plurality of conductors 310 may be disposed on the same or different metal layers disposed in, on, or about all or a portion of the base die 140. In embodiments, each of the conductors 310A-310n included in the first plurality of conductors 310 may be deposited, formed, patterned, or otherwise disposed in a regular or irregular pattern on the upper surface 146 of the base die 140. Although depicted in FIG. 3A as deposited in a straight line, each of the conductors 310A-310n included in the plurality of conductors 310 may have any configuration that includes, but is not limited to, having: any shape, any dimensions (length, height, width, etc.), and/or or any physical configuration (curved, sinusoidal, elliptical, circular, polygonal, etc.).

In embodiments, the spacing or physical distance between each of the conductors 310A-310n included in the first plurality of conductors 310 may be the same or different. In embodiments, the spacing between any two of the conductors 310A-310n included in the first plurality of conductors 310 may be constant or variable. In embodiments, the conductors 310A-310n included in the first plurality of conductors 310 may be disposed parallel to each other and with a constant or variable separation distance between adjacent conductors. The conductors 310A-310n included in the first plurality of conductors 310 may be composed of a metallic or non-metallic, electrically conductive, material. Example metallic materials include, but are not limited to, copper, copper containing alloys, aluminum, aluminum containing alloys, and similar. Example non-metallic materials include conductive polymers and conductive nanoparticles (e.g., silver nanowires) suspended in a polymer matrix.

The second plurality of conductors 320 includes conductors 320A-320n deposited, formed, patterned, or otherwise disposed in, on, about, or across the upper surface 146 of the base die 140. In embodiments, the conductors 320A-320n included in the second plurality of conductors 320 may be disposed on the same or different layers included in the base die 140. In embodiments, some or all of the conductors 320A-320n included in the second plurality of conductors 320 may be disposed on the same or different layers than some or all of the conductors 310A-310n included in the first plurality of conductors 310. Although depicted in FIG. 3A as deposited in a straight line, each of the conductors 320A-320n included in the second plurality of conductors 320 may have any configuration that includes, but is not limited to, having: any shape, any dimensions (length, height, width, etc.), and/or or any physical configuration (curved, sinusoidal, elliptical, circular, polygonal, etc.).

In embodiments, at least one of the conductors 320A-320n included in the second plurality of conductors 320 intersects at least one of the conductors 310A-310n included in the first plurality of conductors 310 to form the electrical mesh network 110. In other embodiments, at least one of the conductors 320A-320n included in the second plurality of conductors 320 intersects each of the conductors 310A-310n included in the first plurality of conductors 310 to form the electrical mesh network 110. In yet other embodiments, each of the conductors 320A-320n included in the second plurality of conductors 320 intersects each of the conductors 310A-310n included in the first plurality of conductors 310 to form the electrical mesh network 110.

Each of the conductors 320A-320n included in the second plurality of conductors 320 may be disposed at any angle measured with respect to the conductors 310A-310n included in the first plurality of conductors 310. In embodiments, at least one of the conductors 320A-320n included in the second plurality of conductors 320 may be disposed orthogonal to at least one of the conductors 310A-310n included in the first plurality of conductors 310. In embodiments, each of the conductors 320A-320n included in the second plurality of conductors 320 may be disposed orthogonal to each of the conductors 310A-310n included in the first plurality of conductors 310 to form the orthogonal electrical mesh network 112.

The electrical mesh network 110 formed by the conductors 310A-310n included in the first plurality of conductors 310 and the conductors 320A-320n included in the second plurality of conductors 320 form an electrical mesh network 110 that includes plurality of nodes. The intersection and/or electrical coupling of a conductive member 310 with a conductive member 320 forms a "node" on the electrical mesh network 110. Where the conductor 310 and the conductor 320 are formed or disposed on the same layer in the base die 130, the node is the location where the conductors 310 and 320 intersect. Where conductor 310 and conductor 320 are formed disposed on different layers in the base die 140, the node occurs at the location where a via or similar conductive feature electrically couples conductor 310 with conductor 320.

In embodiments, each of the conductors 320A-320n included in the second plurality of conductors 320 may be deposited, formed, patterned, or otherwise disposed in a regular or irregular pattern on the upper surface 146 of the base die 140. In embodiments, the spacing between each of the conductors 320A-320n included in the second plurality of conductors 320 may be the same or different. In embodiments, the spacing between any two of the conductors 320A-320n included in the second plurality of conductors 320 may be constant or variable. In embodiments, the conductors 320A-320n included in the second plurality of conductors 320 may be disposed parallel to each other and with a constant or variable separation distance between adjacent conductors. The conductors 320A-320n included in the second plurality of conductors 320 may be composed of a metallic or non-metallic, electrically conductive, material. Example metallic materials include, but are not limited to, copper, copper containing alloys, aluminum, aluminum containing alloys, and similar. Example non-metallic materials include conductive polymers and conductive nanoparticles (e.g., silver nanowires) suspended in a polymer matrix.

The conductors 310A-310n included in the first plurality of conductors 310 and the conductors 320A-320n included in the second plurality of conductors 320 may be formed, patterned, deposited, and/or disposed in, on, across, or about all or a portion of the base die 140 using any currently available or future developed material deposition processes and/or methods. Example, non-limiting, material deposition processes include, but are not limited to: photolithography, printing, electroplating, electroless plating, thin film deposition, atomic layer deposition, and similar. In embodiments, all or a portion of the conductors 310A-310n included in the first plurality of conductors 310 and/or all or a portion of the conductors 320A-320n included in the second plurality of conductors 320 may be disposed at any layer and/or location across the thickness of the base die 140 such that all or a portion of the electrical mesh network 110 is formed internal to the base die 140. In other embodiments, all or a portion of the conductors 310A-310n included in the first plurality of conductors 310 and/or all or a portion of the conductors 320A-320n included in the second plurality of conductors 320 may be disposed in, on, about, or across at least a portion of the lower surface 148 of the base die 140 such that all or a portion of the electrical mesh network 110 is formed on at least a portion of the lower surface 148. In such embodiments one or more through silicon vias (TSVs) may conductively couple one or more semiconductor dies 120 and/or IP cores 130 to the electrical mesh network 110. In yet other embodiments, all or a portion of the conductors 310A-310n included in the first plurality of conductors 310 and/or all or a portion of the conductors 320A-320n included in the second plurality of conductors 320 may be disposed in, on, about, or across at least a portion of the upper surface 146 of the base die 140 such that all or a portion of the electrical mesh network 110 is formed on at least a portion of the upper surface 146.

The third plurality of conductors 330 includes conductors 330A-330n deposited, formed, patterned, or otherwise disposed in, on, about, or across all or a portion of a second layer in the base die 140. In embodiments, the conductors 330A-330n included in the third plurality of conductors 330 may be disposed on the same or different layers included in the base die 140. In embodiments, some or all of the conductors 330A-330n included in the second plurality of conductors 330 may be disposed on the same or different layers than some or all of the conductors 310A-310n included in the first plurality of conductors 310 and/or the conductors 320A-320n included in the second plurality of conductors 320. Each of the conductors 330A-330n included in the third plurality of conductors 330 may have any configuration that includes, but is not limited to, having: any shape, any dimensions (length, height, width, etc.), and/or or any physical configuration (curved, sinusoidal, elliptical, circular, polygonal, etc.).

In embodiments, at least one of the conductors 330A-330n included in the third plurality of conductors 330 conductively couples to at least one node formed by the intersection or conductive coupling of at least one of the conductors 310A-310n included in the first plurality of conductors 310 with one of the conductors 320A-320n included in the second plurality of conductors 320. One or more conductive structures may conductively couple a conductor 330A-330n included the third plurality of conductors 330 to a node include in the electrical mesh network formed by the first plurality of conductors 310 and the second plurality of conductors 320. In embodiments, each of the conductors 330A-330n included in the third plurality of conductors 330 may be disposed at an angle of from about 1° to about 89° measured with respect to at least one of the conductors 310A-310n included in the first plurality of conductors 310 and/or at least one of the conductors 320A-320n included in the second plurality of conductors 320.

The conductors 330A-330n included in the third plurality of conductors 330 may be formed, patterned, deposited, and/or disposed in, on, across, or about all or a portion of the base die 140 using any currently available or future developed material deposition processes and/or methods. Example, non-limiting, material deposition processes include, but are not limited to: photolithography, printing, electroplating, electroless plating, thin film deposition, atomic layer deposition, and similar. In embodiments, all or a portion of the conductors 330A-330n included in the third plurality of conductors 330 may be disposed at any layer and/or location across the thickness of the base die 140 such that all or a portion of the diagonal electrical mesh network 114 is formed at an intermediate point within and/or internal to the base die 140. In other embodiments, all or a portion of the conductors 330A-330n included in the third plurality of conductors 330 may be disposed in, on, about, or across at least a portion of the lower surface 148 of the base die 140 such that all or a portion of the diagonal electrical mesh network 114 is formed on at least a portion of the lower surface 148 of the base die 140. In such embodiments one or more through silicon vias (TSVs) may conductively couple the electrical mesh network 110 formed by the first plurality of conductors 310 and the second plurality of conductors 320 to the diagonal electrical mesh network 114. In yet other embodiments, all or a portion of the conductors 330A-330n included in the third plurality of conductors 330 may be disposed in, on, about, or across at least a portion of the upper surface 146 of the base die 140 such that all or a portion of the diagonal electrical mesh network 114 is formed on at least a portion of the upper surface 146 of the base die 140.

Figure 4:
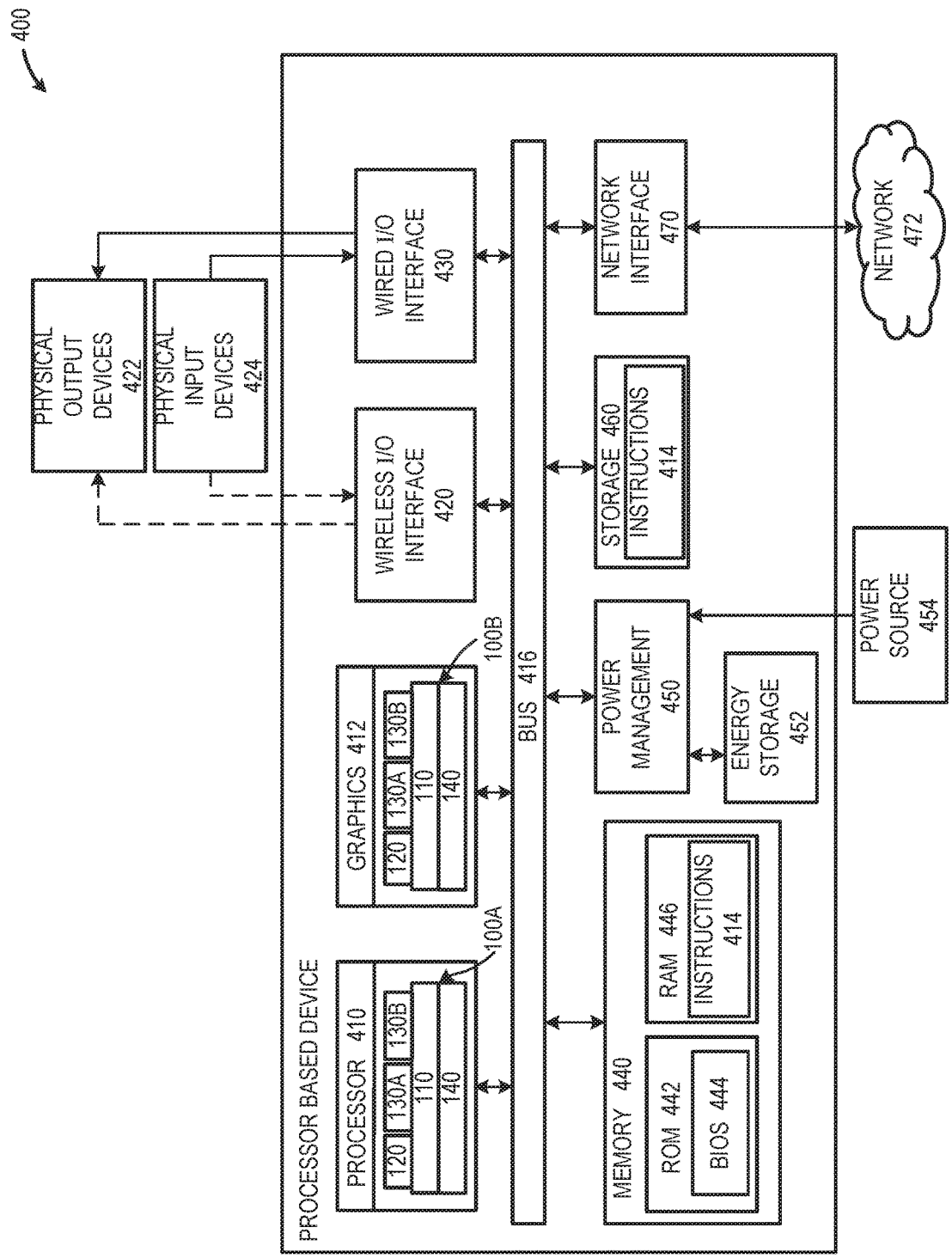
FIG. 4 is a schematic diagram of an illustrative processor-based device that includes one or more semiconductor packages each having an electrical mesh network that includes at least a first electrical mesh network and a conductively coupled diagonal electrical mesh network that conductively couples at least one semiconductor die including circuitry providing a first functionality to a base die including circuitry that provides the first functionality as described in FIGS. 1-3, in accordance with at least one embodiment described herein.

FIG. 4 is a schematic diagram of an illustrative processor-based device 400 that includes one or more semiconductor packages 100A, 100B, each having an electrical mesh network 110 that includes at least a first electrical mesh network 112 and a conductively coupled diagonal electrical mesh network 114 that conductively couples at least one semiconductor die 120 including circuitry 122 providing a first functionality to a base die 140 including circuitry 142 that provides the first functionality as described in FIGS. 1-3, in accordance with at least one embodiment described herein. The processor-based device 400 may include one or more: processor circuits 410, graphics processor circuits 412, wireless input/output (I/O) interfaces 420, wired I/O interfaces 430, memory circuits 440, power management circuits 450, storage devices 460, and/or network interfaces 470. The following discussion provides a brief, general description of the components forming the illustrative processor-based device 400. Example, non-limiting processor-based devices 400 may include: smartphones, wearable computers, portable computing devices, handheld computing devices, desktop computing devices, blade server devices, workstations, and similar.

The processor-based device 400 includes processor circuitry 410 having an electrical mesh network 110 that conductively couples a plurality of semiconductor dies 120 and a plurality of IP cores 130 to a base die 140. In embodiments, the processor-based device 400 may additionally include graphics processor circuitry 412 having an electrical mesh network 110 that conductively couples a plurality of semiconductor dies 120 and/or a plurality of IP cores 130 to a base die 140. In embodiments, the processor-based device 400 includes one or more processor circuits 410 capable of executing machine-readable instruction sets 414, reading data and/or instructions 414 from one or more storage devices 460 and writing data to the one or more storage devices 460. In some embodiments, the processor-based device 400 includes one or more graphics processor circuits 412 capable of executing machine-readable instruction sets 414 and generating an output signal capable of providing a display output to a system user. Those skilled in the relevant art will appreciate that the illustrated embodiments as well as other embodiments may be practiced with other processor-based device configurations, including portable electronic or handheld electronic devices, for instance smartphones, portable computers, wearable computers, consumer electronics, personal computers ("PCs"), network PCs, minicomputers, server blades, mainframe computers, and the like.

The processor circuitry 410 may include any number of hardwired or configurable circuits, some or all of which may include programmable and/or configurable combinations of electronic components, semiconductor devices, and/or logic elements that are disposed partially or wholly in a PC, server, or other computing system capable of executing processor-readable instructions.

The processor-based device 400 includes a bus or similar communications link 416 that communicably couples and facilitates the exchange of information and/or data between various system components including the processor circuitry 410, the graphics processor circuitry 412, one or more wireless I/O interfaces 420, one or more wired I/O interfaces 430, one or more storage devices 460, and/or one or more network interfaces 470. The processor-based device 400 may be referred to in the singular herein, but this is not intended to limit the embodiments to a single processor-based device 400, since in certain embodiments, there may be more than one processor-based device 400 that incorporates, includes, or contains any number of communicably coupled, collocated, or remote networked circuits or devices.

The processor circuitry 410 may include one or more semiconductor packages 100A that include an electrical mesh network 110 coupled to a plurality of physically relatively small semiconductor dies 120 and/or IP cores 130 and to a single, physically relatively large, base die 140. The graphics processor circuitry 412 may include one or more semiconductor packages 100B that include an electrical mesh network 110 coupled to a plurality of physically relatively small semiconductor dies 120 and/or IP cores 130 and to a single, physically relatively large, base die 140.

The processor circuitry 410 may include any number, type, or combination of devices. The processor circuitry 410 may include, but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 4 are of conventional design. Consequently, such blocks need not be described in further detail herein, as they will be understood by those skilled in the relevant art. The bus 416 that interconnects at least some of the components of the processor-based device 400 may employ any known serial or parallel bus structures or architectures.

The system memory 440 may include read-only memory ("ROM") 442 and random access memory ("RAM") 446. A portion of the ROM 442 may be used to store or otherwise retain a basic input/output system ("BIOS") 444. The BIOS 444 provides basic functionality to the processor-based device 400, for example by causing the processor circuitry 410 to load one or more machine-readable instruction sets 414. In embodiments, at least some of the one or more machine-readable instruction sets 414 cause at least a portion of the processor circuitry 410 to provide, create, produce, transition, and/or function as a dedicated, specific, and particular machine, for example a word processing machine, a digital image acquisition machine, a media playing machine, a gaming system, a communications device, or similar.

The processor-based device 400 may include at least one wireless input/output (I/O) interface 420. The at least one wireless I/O interface 420 may be communicably coupled to one or more physical output devices 422 (tactile devices, video displays, audio output devices, hardcopy output devices, etc.). The at least one wireless I/O interface 420 may communicably couple to one or more physical input devices 424 (pointing devices, touchscreens, keyboards, tactile devices, etc.). The at least one wireless I/O interface 420 may include any currently available or future developed wireless I/O interface. Example wireless I/O interfaces include, but are not limited to: BLUETOOTH®, near field communication (NFC), and similar.

The processor-based device 400 may include one or more wired input/output (I/O) interfaces 430. The at least one wired I/O interface 430 may be communicably coupled to one or more physical output devices 422 (tactile devices, video displays, audio output devices, hardcopy output devices, etc.). The at least one wired I/O interface 430 may be communicably coupled to one or more physical input devices 424 (pointing devices, touchscreens, keyboards, tactile devices, etc.). The wired I/O interface 430 may include any currently available or future developed I/O interface. Example wired I/O interfaces include, but are not limited to: universal serial bus (USB), IEEE 1394 ("FireWire"), and similar.

The processor-based device 400 may include one or more communicably coupled, non-transitory, data storage devices 460. The data storage devices 460 may include one or more hard disk drives (HDDs) and/or one or more solid-state storage devices (SSDs). The one or more data storage devices 460 may include any current or future developed storage appliances, network storage devices, and/or systems. Non-limiting examples of such data storage devices 460 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 460 may include one or more removable storage devices, such as one or more flash drives, flash memories, flash storage units, or similar appliances or devices capable of communicable coupling to and decoupling from the processor-based device 400.

The one or more data storage devices 460 may include interfaces or controllers (not shown) communicatively coupling the respective storage device or system to the bus 416. The one or more data storage devices 460 may store, retain, or otherwise contain machine-readable instruction sets, data structures, program modules, data stores, databases, logical structures, and/or other data useful to the processor circuitry 410 and/or graphics processor circuitry 412 and/or one or more applications executed on or by the processor circuitry 410 and/or graphics processor circuitry 412. In some instances, one or more data storage devices 460 may be communicably coupled to the processor circuitry 410, for example via the bus 416 or via one or more wired communications interfaces 430 (e.g., Universal Serial Bus or USB); one or more wireless communications interfaces 420 (e.g., Bluetooth®, Near Field Communication or NFC); and/or one or more network interfaces 470 (IEEE 802.3 or Ethernet, IEEE 802.11, or WiFi®, etc.).

Processor-readable instruction sets 414 and other programs, applications, logic sets, and/or modules may be stored in whole or in part in the system memory 440. Such instruction sets 414 may be transferred, in whole or in part, from the one or more data storage devices 460. The instruction sets 414 may be loaded, stored, or otherwise retained in system memory 440, in whole or in part, during execution by the processor circuitry 410 and/or graphics processor circuitry 412. The processor-readable instruction sets 414 may include machine-readable and/or processor-readable code, instructions, or similar logic capable of providing the speech coaching functions and capabilities described herein.

The processor-based device 400 may include power management circuitry 450 that controls one or more operational aspects of the energy storage device 452. In embodiments, the energy storage device 452 may include one or more primary (i.e., non-rechargeable) or secondary (i.e., rechargeable) batteries or similar energy storage devices. In embodiments, the energy storage device 452 may include one or more supercapacitors or ultracapacitors. In embodiments, the power management circuitry 450 may alter, adjust, or control the flow of energy from an external power source 454 to the energy storage device 452 and/or to the processor-based device 400. The power source 454 may include, but is not limited to, a solar power system, a commercial electric grid, a portable generator, an external energy storage device, or any combination thereof.

For convenience, the processor circuitry 410, the graphics processor circuitry 412, the wireless I/O interface 420, the wired I/O interface 430, the power management circuitry 450, the storage device 460, and the network interface 470 are illustrated as communicatively coupled to each other via the bus 416, thereby providing connectivity between the above-described components. In alternative embodiments, the above-described components may be communicatively coupled in a different manner than illustrated in FIG. 4. For example, one or more of the above-described components may be directly coupled to other components, or may be coupled to each other, via one or more intermediary components (not shown). In another example, one or more of the above-described components may be integrated into the processor circuitry 410 and/or the graphics processor circuitry 412. In some embodiments, all or a portion of the bus 416 may be omitted and the components are coupled directly to each other using suitable wired or wireless connections.

Figure 5:
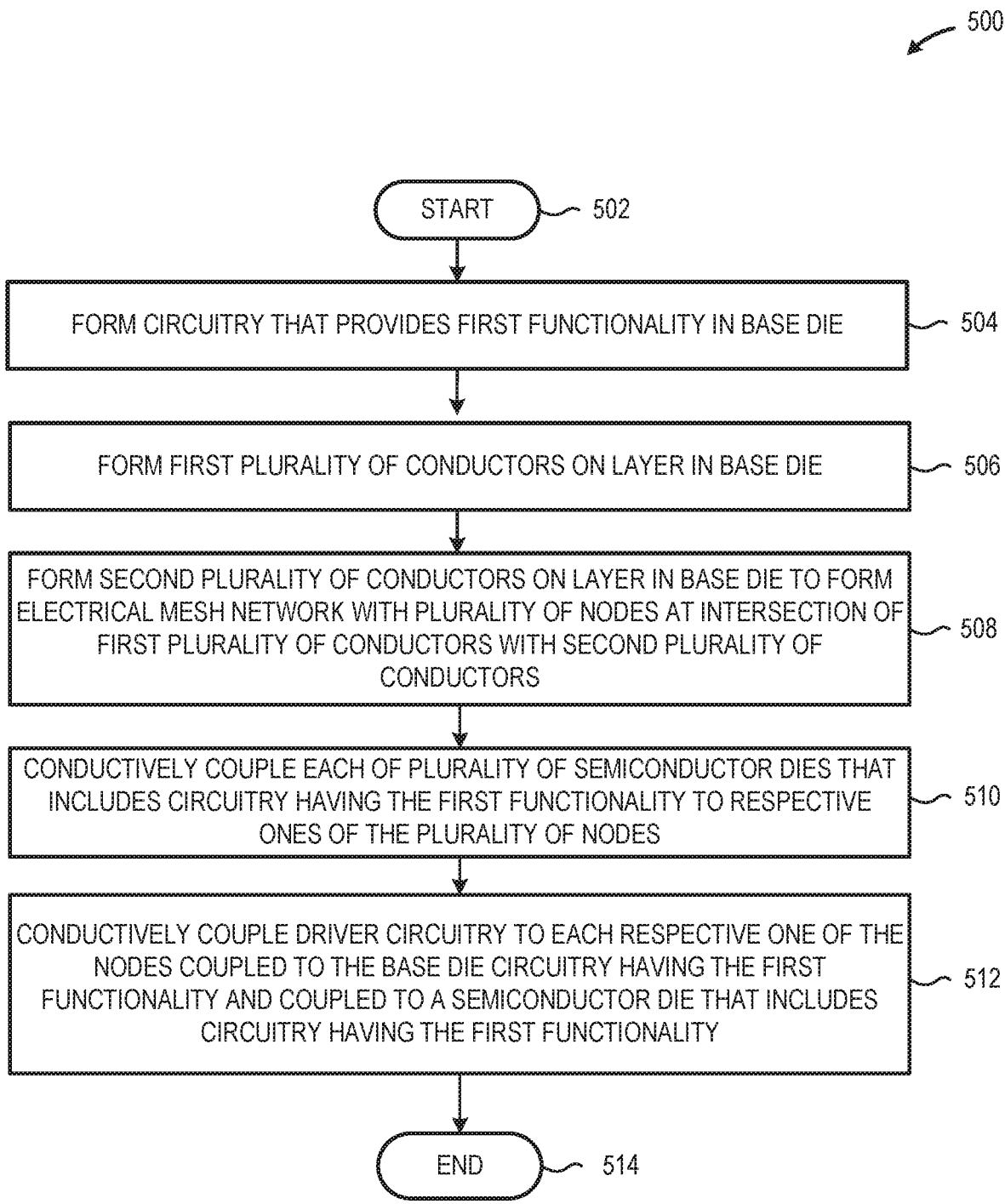
FIG. 5 is a high-level logic flow diagram depicting an illustrative method for conductively coupling, via an electrical mesh network, at least one semiconductor die that includes circuitry having a first functionality to a base die that includes circuitry having a redundant first functionality, in accordance with at least one embodiment described herein.

FIG. 5 is a high-level logic flow diagram depicting an illustrative method 500 for conductively coupling, via an electrical mesh network 110, at least one semiconductor die 120 that includes circuitry 122 having a first functionality to a base die 140 that includes circuitry 142 having a redundant first functionality, in accordance with at least one embodiment described herein. The circuitry 122 included in the semiconductor die 120 and the circuitry 142 included in the base die 140 conductively couple to a common contact pad 152. Driver circuitry 160 selectively activates either the circuitry 122 in the semiconductor die 120 or the circuitry 142 in the base die 140. The use of semiconductor die circuitry 122 and base die circuitry 142, both providing the first functionality, provides a level of redundancy in a semiconductor package 100. This redundancy improves reliability of the semiconductor package 100. The method 500 commences at 502.

At 504, circuitry 142 is formed in the base die 140. The base die circuitry 142 may include any number and/or combination of currently available or future developed electronic components, semiconductor devices, and/or logic elements conductively coupled using conductive members such as traces and vias and configured to provide the first functionality. The base die circuitry 142 first functionality may include, but is not limited to, one or more of the following: wireless communication processing, wired communication processing, data storage and/or retrieval, processing, graphics processing, input/output processing, or combinations thereof. In embodiments, the base die circuitry 142 may include a first operational parameter set (e.g., bandwidth, operating voltage, operating current, operating temperature, clock speed, and similar). In embodiments, some or all of the electronic components, semiconductor devices, and/or logic elements included in the base die circuitry 142 may be disposed in an upper portion 242 of the region of the base die 140. In embodiments, the base die circuitry 142 may conductively couple to one or more conductive members 111 disposed in the electrical mesh network 110. In embodiments, the base die circuitry 142 may conductively couple to one or more conductive features, such as one or more contact pads, lands, grooves, pins, or similar features disposed in, on, about, or across all or a portion of the lower surface 148 of the base die 140.

At 506, the conductors 310A-310$n$ included in the first plurality of conductors 310 are deposited, formed, patterned, or otherwise disposed in, on, about, or across all or a portion of a layer included in the base die 140. In embodiments, some or all of the conductors 310A-310$n$ included in the first plurality of conductors 310 may be deposited, formed, patterned, or otherwise disposed on an intermediate layer included in the base die 140. In other embodiments, some or all of the conductors 310A-310$n$ included in the first plurality of conductors 310 may be deposited, formed, patterned, or otherwise disposed on the uppermost layer (i.e., the upper surface 146) of the base die 140. In yet other embodiments, some or all of the conductors 310A-310$n$ included in the first plurality of conductors 310 may be deposited, formed, patterned, or otherwise disposed on a plurality of layers included in the base die 140. In embodiments, one or more vias or similar conductive structures may conductively couple conductors 310A-310$n$ that are deposited, formed, patterned, or otherwise disposed on different layers within the base die 140.

The conductors 310A-310$n$ included in the first plurality of conductors 310 may be deposited, formed, patterned, or otherwise disposed in, on, about, or across all or a portion of a base die 140 using any currently available and/or future developed material deposition process or method. For example, the conductors 310A-310$n$ included in the first plurality of conductors 310 may be formed or otherwise deposited using a photolithographic process, an electrode-position process, a vapor deposition process, an atomic layer deposition process, a printing process, a three-dimensional printing process, or combinations thereof.

The conductors 310A-310$n$ included in the first plurality of conductors 310 may be formed using any conductive material including, but not limited to, metals (copper, aluminum, etc.), metal alloys (copper containing alloys, aluminum containing alloys, etc.), conductive non-metals (polymers, conductive nanoparticle matrices, etc.) or any combination thereof. The conductors 310A-310$n$ may have any physical size, shape, geometry, and/or cross-sectional profile. The conductors 310A-310$n$ may be disposed or otherwise deposited in any uniform or non-uniform pattern including, but not limited to, straight lines, circles, arcs, polygons, or combinations thereof. The conductors 310A-310$n$ may be conductively coupled to the support circuitry 144 formed in, on, about, or across the base die 140 using vias, metal traces, or similar electrically conductive structures. The conductors 310A-310$n$ may be conductively coupled to contact pads or similar electrically conductive features on the lower surface 148 of the base die 140.

At 508, the conductors 320A-320$n$ included in a second plurality of conductors 320 are deposited, formed, patterned, or otherwise disposed in, on, about, or across all or a portion of a base die 140. In embodiments, some or all of the conductors 320A-320$n$ included in the second plurality of conductors 320 may be deposited, formed, patterned, or otherwise disposed on an intermediate layer included in the base die 140. In other embodiments, some or all of the conductors 320A-320$n$ included in the second plurality of conductors 320 may be deposited, formed, patterned, or otherwise disposed on the uppermost layer (i.e., the upper surface 146) of the base die 140. In yet other embodiments, some or all of the conductors 320A-320$n$ included in the second plurality of conductors 320 may be deposited, formed, patterned, or otherwise disposed on a plurality of layers included in the base die 140. In embodiments, one or more vias or similar conductive structures may conductively couple conductors 320A-320$n$ that are deposited, formed, patterned, or otherwise disposed on different layers within the base die 140.

The conductors 320A-320n included in the second plurality of conductors 320 may be patterned, formed, deposited, or otherwise disposed in, on, about, or across all or a portion of a base die 140 using any currently available and/or future developed material deposition process or method. For example, the conductors 320A-320n may be formed or otherwise deposited using a photolithographic process, an electrodeposition process, a vapor deposition process, an atomic layer deposition process, a printing process, a three-dimensional printing process, or combinations thereof.

The conductors 320A-320n included in the second plurality of conductors 320 may be formed using any conductive material including, but not limited to, metals (copper, aluminum, etc.), metal alloys (copper containing alloys, aluminum containing alloys, etc.), conductive non-metals (polymers, conductive nanoparticle matrices, etc.) or any combination thereof. The conductors 320A-320n included in the second plurality of conductors 320 may have any physical size, shape, geometry, and/or cross-sectional profile. The conductors 320A-320n included in the second plurality of conductors 320 may be disposed or otherwise deposited in any uniform or non-uniform pattern including, but not limited to, straight lines, circles, arcs, polygons, or combinations thereof. The conductors 320A-320n included in the second plurality of conductors 320 may be conductively coupled to support circuitry 144 formed in, on, about, or across the base die 140 using vias, metal traces, or similar electrically conductive structures. The conductors 320A-320n may be conductively coupled to contact pads or similar electrically conductive features on the lower surface 148 of the base die 140.

In embodiments, at least one of the conductors 320A-320n included in the second plurality of conductors 320 intersects or is conductively coupled to at least one of the conductors 310A-310n included in the first plurality of conductors 310. In other embodiments, each of the conductors 320A-320n included in the second plurality of conductors 320 intersects or is conductively coupled to each of the conductors 310A-310n included in the first plurality of conductors 310. The conductors 320A-320n included in the second plurality of conductors 320 may intersect the conductors 310A-310n included in the first plurality of conductors 310 at any angle measured with respect to at least one of the conductors 310A-310n. In embodiments the conductors 320A-320n included in the second plurality of conductors 320 may intersect the conductors 310A-310n included in the first plurality of conductors 310 at an angle of approximately 90 degrees (i.e., each of the conductors 320A-302n is orthogonal to each of the conductors 310A-310n to form the orthogonal electrical mesh network 112).

Each of a plurality of nodes on the electrical mesh network 110 forms at the locations where the first plurality of conductors 310 and the second plurality of conductors 320 intersect or are conductively coupled (i.e., those locations where a conductor 310A-310n and a conductor 320A-320n intersect or conductively couple). Each of the electrical mesh network nodes creates a potential connection point for a semiconductor die 120 or an IP core 130. In embodiments, each node may have a single conductive coupling to the semiconductor die 120 or the IP core 130 and/or the support circuitry 142 disposed in the base die 140. In other embodiments, each node on the electrical mesh network 110 may have a plurality of conductive couplings to the semiconductor die 120 or the IP core 130 and/or the support circuitry 142 disposed in the base die 140. A node on the electrical mesh network 110 may therefore represent a conductive coupling that includes any number of (i.e., one or more) connections.

At 510, each of a plurality of semiconductor dies 120 are conductively and physically coupled to respective ones of the plurality of nodes included in the electrical mesh network 110. At least some of the plurality of semiconductor dies 120 include circuitry 122 providing the first functionality. The semiconductor die circuitry 122 may include any number and/or combination of currently available or future developed electronic components, semiconductor devices, and/or logic elements conductively coupled using conductive members such as traces and vias and configured to provide the first functionality. The semiconductor die circuitry 122 first functionality may include, but is not limited to, one or more of the following: wireless communication processing, wired communication processing, data storage and/or retrieval, processing, graphics processing, input/output processing, or combinations thereof. In embodiments, the semiconductor die circuitry 122 may include a second operational parameter set (e.g., bandwidth, operating voltage, operating current, operating temperature, clock speed, and similar). In embodiments the second operational parameter set may differ from the first operational parameter set of the base die circuitry 142. For example, when performing the first functionality, the semiconductor die circuitry 122 may have a greater or lesser operating current limit than the base die circuitry 142.

In embodiments, some or all of the electronic components, semiconductor devices, and/or logic elements included in the semiconductor die circuitry 122 may be disposed in a lower portion 222 of the respective semiconductor die 120. In embodiments, the semiconductor die circuitry 122 may conductively couple to a node included in the electrical mesh network 110. In embodiments, the semiconductor die circuitry 122 may conductively couple to one or more conductive features, such as one or more contact pads, lands, grooves, pins, or similar features disposed in, on, about, or across all or a portion of the an exterior surface of the semiconductor die 120. For example, the semiconductor die circuitry 122 may conductively couple to a contact pad or similar conductive structure disposed on at least a portion of the exterior surface of the semiconductor die 120.

The semiconductor die circuitry 122 providing the first functionality and the base die circuitry 142 providing the first functionality may conductively couple to a common conductive structure 152, such as a contact pad disposed on a substrate 150. Such an arrangement allows either the semiconductor die circuitry 122 or the base die circuitry 142 to transmit and/or receive information and/or data via the conductive structure 152. In at least some embodiments, the conductive structure 152 may conductively couple to one or more external systems or devices.

At 512, driver circuitry 160 to selectively conductively couple either the semiconductor die circuitry 122 or the base die circuitry 142 to the electrical mesh network 110 is coupled to the semiconductor die circuitry 122 and to the base die circuitry 142. In embodiments, the driver circuitry 160 provides a bidirectional communication pathway between the conductive structure 152 and one or more systems, devices, or combinations of systems and devices included in the semiconductor package 100. In embodiments, the driver circuitry 160 may autonomously selectively couple either the semiconductor die circuitry 122 or the base die circuitry 142 to the conductive structure 152. For example, if one or more operating parameters (bandwidth, voltage, current, etc.) exceeds a defined threshold value, the driver circuitry may autonomously transition between the semiconductor die circuitry 122 and the base die circuitry 142. In another example, if one or more systems or devices included in the semiconductor package 100 detect a fault and/or failure of either the semiconductor die circuitry 122 or the base die circuitry 142, the driver circuitry 160 may autonomously transition between the semiconductor die circuitry 122 and the base die circuitry 142. In embodiments, the driver circuitry 160 may transition between the semiconductor die circuitry 122 and the base die circuitry responsive to receipt of one or more user generated or provided input signals to transition between the semiconductor die circuitry 122 and the base die circuitry 142. In some embodiments, the driver circuitry 160 may reversibly selectively transition between the semiconductor die circuitry 122 and the base die circuitry 142. In other embodiments, the driver circuitry 160 may irreversibly transition between the semiconductor die circuitry 122 and the base die circuitry 142. The method 500 concludes at 514.

Figure 6:
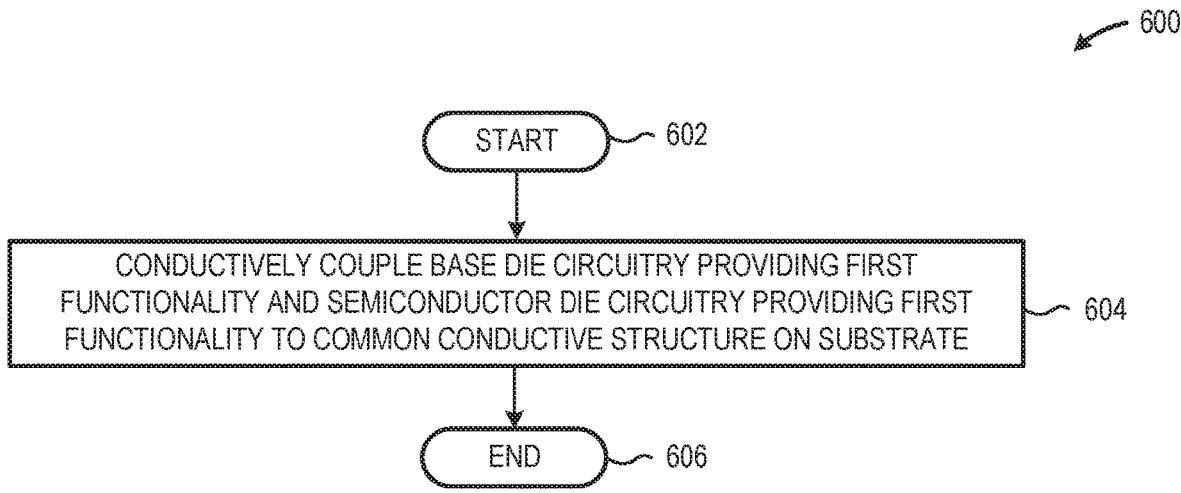
FIG. 6 is a high-level flow diagram of an illustrative method of coupling semiconductor die circuitry providing a first functionality and base die circuitry providing the first functionality to a common conductive structure, in accordance with at least one embodiment described herein.

FIG. 6 is a high-level flow diagram of an illustrative method 600 of coupling semiconductor die circuitry 122 providing a first functionality and base die circuitry 142 providing the first functionality to a common conductive structure 152, in accordance with at least one embodiment described herein. The method 600 may be used in conjunction with the method 500 described in detail in FIG. 5. Conductively coupling both the semiconductor die circuitry 122 and the base die circuitry 142 to a common conductive structure 152 provides a degree of redundancy in the semiconductor package 100, beneficially improving the reliability of the semiconductor package and reducing the rework attributable to failed or faulty circuitry. The method 600 commences at 602.

At 604, the semiconductor die circuitry 122 and the base die circuitry 142 conductively couple to a common conductive structure 152. In at least some embodiments, the conductive structure may include one or more pads, lands, grooves, pins, or similar structures disposed on the substrate 150 supporting the base die 140. In some implementations, one or more conductive members 252, such as one or more microbumps or solder balls, may conductively couple the base die circuitry 142 to the conductive structure 152 included in the substrate 150. In some implementations, one or more conductive members 156 conductively couples the semiconductor die circuitry 122 to the conductive structure 152 included in the substrate 150. In other embodiments, one or more through silicon vias (TSVs) and/or the electrical mesh network 110 may conductively couple the semiconductor die circuitry 122 to the conductive structure 152 included in the substrate 150. The method 600 concludes at 606.

Figure 7:
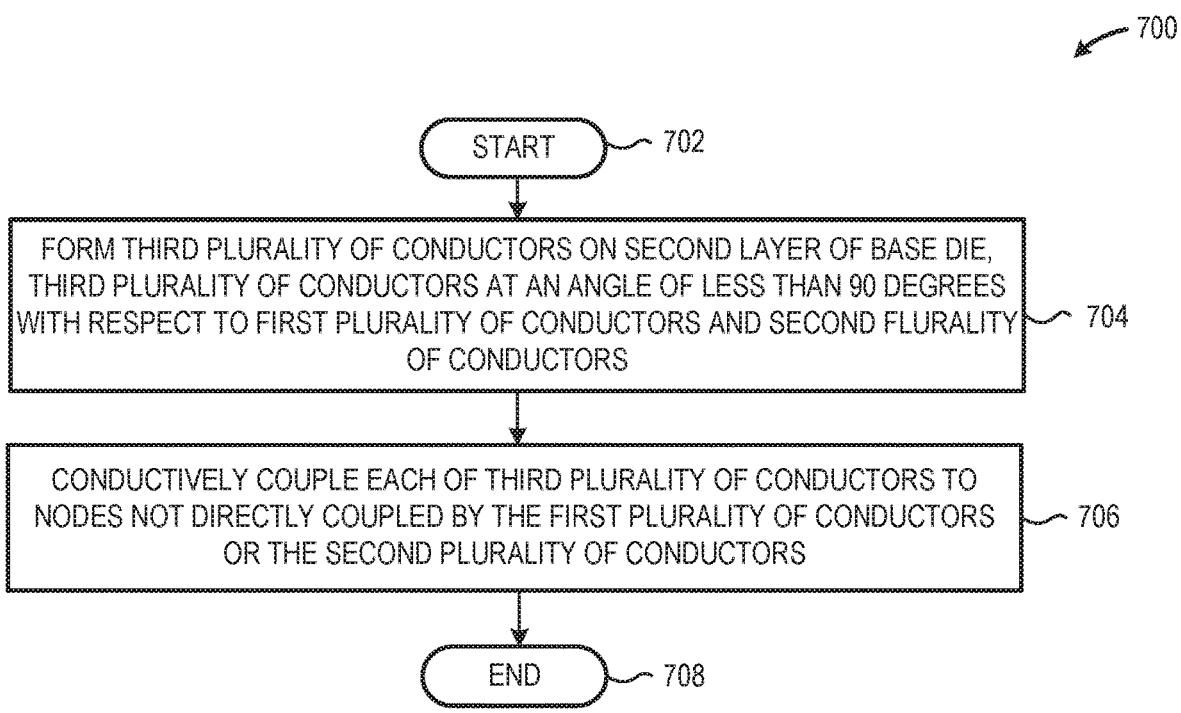
FIG. 7 is a high-level flow diagram of an illustrative method of forming a diagonal electrical mesh network using conductors included in a third plurality of conductors that conductively couple two non-adjacent nodes in the electrical mesh network that are not directly coupled (i.e., coupled by a conductor that does not pass through ANY intervening nodes) by either the first plurality of conductors or the second plurality of conductors, in accordance with at least one embodiment described herein.

FIG. 7 is a high-level flow diagram of an illustrative method 700 of forming a diagonal electrical mesh network 114 using conductors 330A-330$n$ included in a third plurality of conductors 330 that conductively couple two non-adjacent nodes in the electrical mesh network 110 that are not directly coupled (i.e., coupled by a conductor that does not pass through ANY intervening nodes) by either the conductors 310A-310$n$ included in the first electrical mesh network 112 or the conductors 320A-320$n$ included in the second plurality of conductors 320, in accordance with at least one embodiment described herein. The method 700 may be used in conjunction with any of the methods 500 and 600 described in detail with regard to FIGS. 5 and 6. Communication through a two dimensional mesh network formed by conductors 310A-310$n$ included in the first plurality of conductors 310 that intersect conductors 320A-320$n$ included in the second plurality of conductors 320 may require signals to pass through multiple intervening nodes included in the electrical mesh network 110 to reach a designated remote destination node. The conductors 330A-330$n$ included in the third plurality of conductors 330 beneficially provide conductive pathways that minimize the number of intervening nodes and permit greater communication bandwidth and reduced power consumption. The method 700 commences at 702.

At 704, the conductors 330A-330$n$ included in a third plurality of conductors 330 are formed on a second layer in the base die 140. In embodiments, the third plurality of conductors 330 may be conductively coupled to the first plurality of conductors 310 and the second plurality of conductors 320 at one or more nodes formed at the intersection of the conductors 310A-310$n$ included in the first plurality of conductors 310 and the conductors 320A-320$n$ included in the second plurality of conductors 320. In at least some embodiments, the conductors 310A-310$n$ included in the first plurality of conductors 310 may be disposed orthogonally to the conductors 320A-320$n$ included in the second plurality of conductors 320 to form an orthogonal electrical mesh network 112. In such embodiments, the conductors 330A-330$n$ included in the third plurality of conductors 330 may be disposed at a non-90° angle measured with respect to the first plurality of conductors 310 an with respect to the second plurality of conductors 320.

The conductors 330A-330$n$ included in the third plurality of conductors 330 are deposited, formed, patterned, or otherwise disposed in, on, about, or across all or a portion of the second layer included in the base die 140. In embodiments, some or all of the conductors 330A-330$n$ included in the third plurality of conductors 330 may be deposited, formed, patterned, or otherwise disposed on an intermediate second layer included in the base die 140. In other embodiments, some or all of the conductors 330A-330$n$ included in the third plurality of conductors 330 may be deposited, formed, patterned, or otherwise disposed on the uppermost layer (i.e., the upper surface 146) of the base die 140. In yet other embodiments, some or all of the conductors 330A-330$n$ included in the third plurality of conductors 330 may be deposited, formed, patterned, or otherwise disposed on a plurality of layers included in the base die 140. In embodiments, one or more vias or similar conductive structures may conductively couple conductors 330A-330$n$ that are deposited, formed, patterned, or otherwise disposed on different layers within the base die 140.

The conductors 330A-330$n$ included in the third plurality of conductors 330 may be patterned, formed, deposited, or otherwise disposed in, on, about, or across all or a portion of a base die 140 using any currently available and/or future developed material deposition process or method. For example, the conductors 330A-330$n$ may be formed or otherwise deposited using a photolithographic process, an electrodeposition process, a vapor deposition process, an atomic layer deposition process, a printing process, a three-dimensional printing process, or combinations thereof.

The conductors 330A-330$n$ included in the third plurality of conductors 330 may be formed using any conductive material including, but not limited to, metals (copper, aluminum, etc.), metal alloys (copper containing alloys, aluminum containing alloys, etc.), conductive non-metals (polymers, conductive nanoparticle matrices, etc.) or any combination thereof. The conductors 330A-330$n$ included in the third plurality of conductors 330 may have any physical size, shape, geometry, and/or cross-sectional profile. The conductors 330A-330n included in the third plurality of conductors 330 may be disposed or otherwise deposited in any uniform or non-uniform pattern including, but not limited to, straight lines, circles, arcs, polygons, or combinations thereof. The conductors 330A-330n included in the third plurality of conductors 330 may be conductively coupled to support circuitry 144 formed in, on, about, or across the base die 140 using vias, metal traces, or similar electrically conductive structures. The conductors 330A-330n may be conductively coupled to contact pads or similar electrically conductive features on the lower surface 148 of the base die 140.

At 706, each of the conductors 330A-330n included in the third plurality of conductors 330 is conductively coupled to nodes included in the orthogonal electrical mesh network 112 formed by the first plurality of conductors 310 and the second plurality of conductors 320. In embodiments, each of the conductors 310A-310n may be conductively coupled between two nodes that are not directly coupled by either the first plurality of conductors 310 or the second plurality of conductors 320. In embodiments, at least some of the conductors 330A-330n may be conductively coupled to a conductive structure such as a trace or via that conductively couples to a node included in the orthogonal electrical mesh network 112. The conductively coupled conductors 330A-330n form the diagonal electrical mesh network 114. The method 700 concludes at 708.

Figure 8:
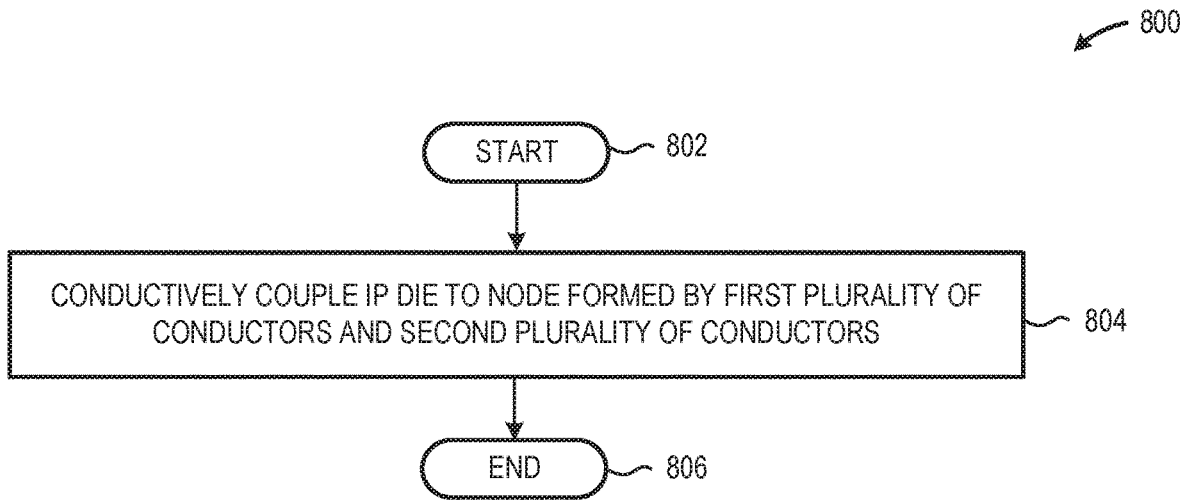
FIG. 8 is a high-level logic flow diagram of an illustrative method of conductively coupling one or more IP cores to respective nodes included in the electrical mesh network, in accordance with at least one embodiment described herein.

FIG. 8 is a high-level logic flow diagram of an illustrative method 800 of conductively coupling one or more IP cores 130A-130n to respective nodes included in the electrical mesh network 110, in accordance with at least one embodiment described herein. The method 800 may be used in conjunction with any of the methods 500, 600, and 700 described with regard to FIGS. 5, 6, and 7. In embodiments, in addition to the semiconductor dies 120 coupled to the electrical mesh network 110, a plurality of IP cores 130 may also be conductively coupled to the electrical mesh network 110. The method 800 commences at 802.

At 804, each of a plurality of IP cores 130 is conductively coupled to a respective one of the plurality of nodes included in the electrical mesh network 110. Each of the semiconductor intellectual property cores ("IP cores") 130 may include, but is not limited to, a reusable unit of logic, cell, or integrated circuit/chip/chiplet layout design. Example IP cores 130 include, but are not limited to, universal asynchronous receiver/transmitter (UARTs); central processing units (CPUs); graphics processing units (GPUs); IEEE 802.11 Ethernet controllers; Peripheral Component Interconnect (PCI) interfaces; storage devices; and similar. Each of the IP cores 130 includes circuitry (e.g., processor core circuitry) disposed on a relatively small (compared to the base die 140) integrated circuit. In embodiments, each of the IP cores 120 may occupy the same area on the upper surface 132 of the base die 130. In embodiments, the IP cores 120 may occupy different areas on the upper surface 132 of the base die 130. the may have a surface area of less than: about 25 square millimeters (mm$^2$); about 20 mm$^2$; about 15 mm$^2$; about 12 mm$^2$; about 10 mm$^2$; about 8 mm$^2$; or about 5 mm$^2$.

Each of the IP cores 140 includes one or more conductive fixtures (contact bumps, pads, lands, grooves, pins, etc.) disposed in, on, about, or across at least a portion of the lower surface of the IP core 130. The one or more conductive fixtures may be disposed in a fixed pattern or arrangement in, on, about or across the lower surface of each of the IP cores 130. Maintaining the conductive features in a fixed pattern or arrangement beneficially permits the replacement and/or substitution of IP cores 130 without requiring a redesign of the base die 140. Since IP cores 130 may be readily substituted without requiring a complete rework of the base die 140, time-to-market is advantageously reduced and market responsiveness beneficially improved. The method 800 concludes at 806.

Figure 9:
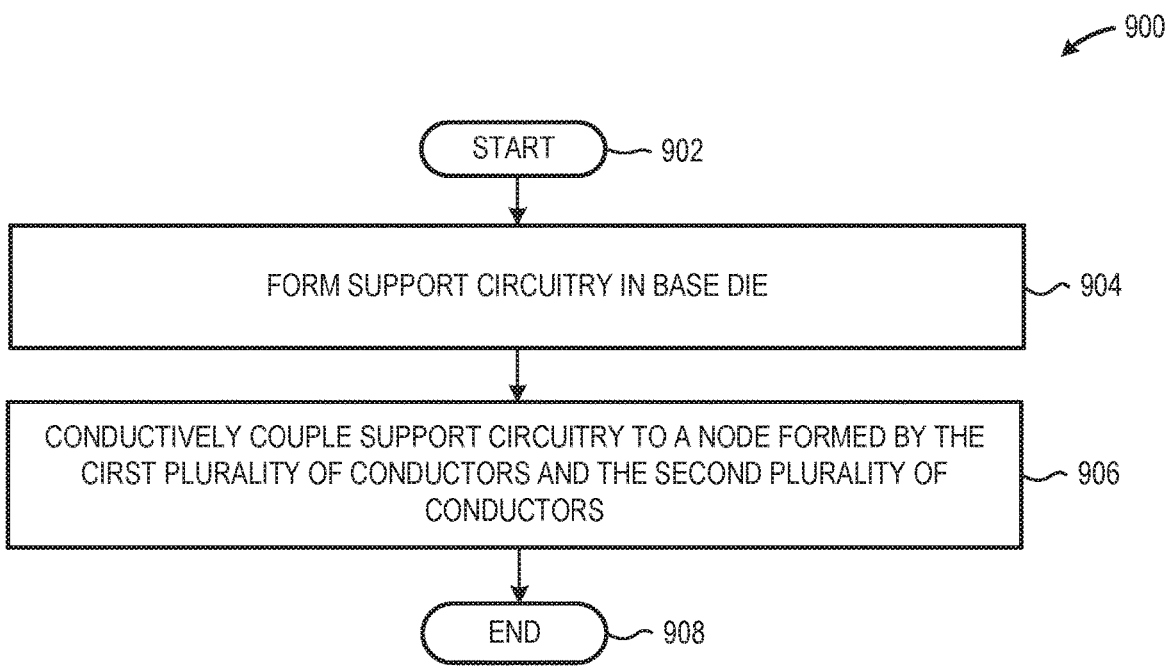
FIG. 9 is a high-level flow diagram of an illustrative method of forming support circuitry in the base die, in accordance with at least one embodiment described herein.

FIG. 9 is a high-level flow diagram of an illustrative method 900 of forming support circuitry 144 in the base die 140, in accordance with at least one embodiment described herein. The method 900 may be used in conjunction with any of the methods 500, 600, 700, and 800 described with regard to FIGS. 5, 6, 7, and 8. In embodiments, the base die 140 may include support circuitry 144 coupled to the electrical mesh network 110. The method 900 commences at 902.

At 904, support circuitry 144 is deposited, patterned, formed, or otherwise disposed in, on, or about the base die 140. In embodiments, the support circuitry 140 may include, but is not limited to, one or more of the following: data storage circuitry; cache circuitry; input/output circuitry; processor voltage regulation circuitry (e.g., fully integrated voltage regulator or "FIVR" circuitry); communications interface circuitry; bus interface circuitry; and combinations thereof. In embodiments, the base die 140 is relatively larger than each of the semiconductor dies 120 and/or IP cores 130. In embodiments, the base die 140 may have a surface area of less than: about 3000 square millimeters (mm$^2$); about 2500 mm$^2$; about 2000 mm$^2$; about 1500 mm$^2$; about 1000 mm$^2$; about 700 mm$^2$; or about 500 mm$^2$. In embodiments, all or a portion of the peripheral regions of the base die 140 may include semiconductor dies 120 that include circuitry 122 providing the first functionality.

In embodiments, all or a portion of the central region of the base die 140 bounded by the peripheral regions may include support circuitry 144 that supports one or more operations performed by each of the plurality of IP cores 130. In such embodiments, the IP cores 130 may be coupled to one or more nodes included in the electrical mesh network 110. Disposing the IP cores 130 proximate the support circuitry 144 in the base die 140 beneficially improves bandwidth and reduces power consumed in transmitting data to a remotely located resource, improving the performance of the semiconductor package 100.

At 906, the support circuitry 144 is conductively coupled to one or more of the plurality of nodes included in the electrical mesh network 110. At least a portion of the electrical mesh network 110 may be disposed, patterned, deposited, or otherwise formed in, on, about, or across at least a portion of the upper surface 146 of the base die 140. In addition to conductively coupling to the electrical mesh network 110, at least some of the IP cores 130 may conductively couple to the support circuitry 144 disposed in the base die 130. In embodiments, one or more conductive structures may be deposited, patterned, formed, or otherwise disposed in, on, about, or across all or a portion of the upper surface 146 of the base die 140 to couple at least one IP core 130 to the support circuitry 144 carried by the base die 140. Such conductive structures may include, but are not limited to: metal traces and vias.

While FIGS. 5, 6, 7, 8, and 9 illustrate various operations according to one or more embodiments, it is to be understood that not all of the operations depicted in FIGS. 5, 6, 7, 8, and 9 are necessary for other embodiments. Indeed, it is fully contemplated herein that in other embodiments of the present disclosure, the operations depicted in FIGS. 5, 6, 7, 8, and 9, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), rewritable compact disks (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods of conductively coupling a plurality of relatively physically small semiconductor dies and IP core dies to a relatively physically large base die using a three dimensional electrical mesh network. At least some of the semiconductor dies include circuitry to provide a first functionality. The base die includes circuitry to provide a redundant first functionality to the semiconductor die circuitry. The semiconductor die circuitry and the base die circuitry selectively conductively couple to a common conductive structure such that either the semiconductor die circuitry or the base die circuitry is able to provide the first functionality at the conductive structure. Driver circuitry may autonomously or manually, reversibly or irreversibly, cause the semiconductor die circuitry and the base die circuitry couple to the conductive structure. The redundant circuitry providing the first function improves the operational flexibility and reliability of the semiconductor package.

The three dimensional electrical mesh network includes a first plurality of conductors and a second plurality of conductors. The conductors forming the first plurality of conductors intersect the conductors forming the second plurality of conductors. The intersections form a plurality of nodes. The first plurality of conductors may be disposed orthogonal to the second plurality of conductors to form an orthogonal electrical mesh network that includes a plurality of nodes. Conductors included in a third plurality of conductors may conductively couple to nodes that are not directly coupled by either the first plurality of conductors or the second plurality of conductors.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for providing an electrical mesh network that communicably couples a plurality of relatively small, limited function, IP cores to a relatively large base die that includes support circuitry for use by the IP cores.

According to example 1, there is provided a semiconductor package. The semiconductor package may include: an electrical mesh network that includes: a first plurality of conductors; a second plurality of conductors, each of the second plurality of conductors intersecting at least one of the first plurality of conductors to form a plurality of nodes, each of the nodes at a respective intersection of one of the first plurality of conductors with one of the second plurality of conductors; a base die having an upper surface and a lower surface, the base die including circuitry providing a first functionality conductively coupled to at least one of the plurality of nodes; a plurality of second semiconductor dies, at least one of the plurality of second semiconductor dies including circuitry providing the first functionality; each of the plurality of second semiconductor dies conductively coupled to a respective one of the plurality of nodes; and driver circuitry to selectively conductively couple the electrical mesh network to at least one of the first semiconductor die circuitry providing the first functionality or the at least one second semiconductor die providing the first functionality.

Example 2 may include elements of example 1 where each of the first plurality of conductors is disposed orthogonally to at least one of the second plurality of conductors.

Example 3 may include elements of any of examples 1 or 2 where each of the first plurality of conductors intersects and conductively couples to each of the second plurality of conductors.

Example 4 may include elements of any of examples 1 through 3 where the first functionality comprises a input/output (I/O) functionality and where the base die circuitry providing the I/O functionality and the semiconductor die circuitry providing the I/O functionality conductively couple to a common conductive structure.

Example 5 may include elements of any of examples 1 through 4 where at least one of the plurality of semiconductor dies includes processor core circuitry.

Example 6 may include elements of any of examples 1 through 5 where the base die may further include voltage regulator circuitry, the voltage regulator circuitry conductively coupled to the processor core circuitry included in at least one of the plurality of second semiconductor dies.

Example 7 may include elements of any of examples 1 through 6 where the base die may include a plurality of vias that conductively couple at least one of: the electrical mesh network and the base die circuitry to contact pads disposed on the lower surface of the base die.

Example 8 may include elements of any of examples 1 through 7 where the base die circuitry may further include at least one active element.

Example 9 may include elements of any of examples 1 through 8 where the at least one active element may include at least one transistor disposed proximate the upper surface of the base die, the at least one transistor conductively coupled to the electrical mesh network.

Example 10 may include elements of any of examples 1 through 9 where each of the plurality of semiconductor dies includes an upper surface and a lower surface; and where at least one of the plurality of semiconductor dies includes at least one transistor disposed proximate the lower surface of the respective semiconductor die.

Example 11 may include elements of any of examples 1 through 10 where each of the first plurality of conductors may include a plurality of conductors patterned on the upper surface of the base die.

Example 12 may include elements of any of examples 1 through 11 where each of the second plurality of conductors may include a plurality of conductors patterned on the upper surface of the base die.

Example 13 may include elements of any of examples 1 through 12 where the base die may further include at least one of: voltage regulator circuitry, controller circuitry, and memory circuitry.

Example 14 may include elements of any of examples 1 through 13 and the system may further include: a third plurality of conductors conductively coupled to a plurality of nodes not directly conductively coupled by the first plurality of conductors and the second plurality of conductors.

Example 15 may include elements of any of examples 1 through 14 where the base die may include a multi-layered integrated circuit and where the first plurality of conductors and the second plurality of conductors are disposed on a first layer of the multi-layer integrated circuit and the third plurality of conductors is disposed on a second layer of the multi-layer integrated circuit.

Example 16 may include elements of any of examples 1 through 15 where an electrically conductive via couples at least one of the third plurality of conductors to a respective one of the plurality of nodes.

Example 17 may include elements of any of examples 1 through 16 where each of the first plurality of conductors is disposed orthogonally to each of the second plurality of conductors to provide an orthogonal electrical mesh network.

Example 18 may include elements of any of examples 1 through 17 where the third plurality of conductors may include a plurality of diagonal conductors, each of the plurality of diagonal conductors disposed at an angle of less than 90° measured with respect to the first plurality of conductors and with respect to the second plurality of conductors.

Example 19 may include elements of any of examples 1 through 18 and the system may include a substrate having at least one conductive structure, the at least one conductive structure communicably coupled to the base die circuitry providing the first functionality and to semiconductor die circuitry providing the first functionality.

According to example 20, there is provided a method. The method may include: forming circuitry providing a first functionality in a base die; forming a first plurality of conductors on a first layer of the base die; forming a second plurality of conductors on the first layer of the base die, where: each of the first plurality of conductors are spaced apart from the remaining first plurality of conductors; each of the second plurality of conductors are spaced apart from the remaining second plurality of conductors; and each of the first plurality of conductors intersects and conductively couples to at least one of the second plurality of conductors to form an electrical mesh network that includes a plurality of nodes, at least a portion of the plurality of nodes conductively coupled the base die circuitry providing the first functionality; conductively coupling at least one semiconductor die to a respective one of the portion of the plurality of nodes coupled to the first plurality of conductors and to the second plurality of conductors, the at least one semiconductor die including circuitry providing the first functionality; and conductively coupling driver circuitry to the respective one of the portion of the plurality of nodes coupled to the first plurality of conductors and to the second plurality of conductors, the driver circuitry to selectively conductively couple at least the base die circuitry providing the first functionality or the semiconductor die circuitry providing the first functionality to the electrical mesh network.

Example 21 may include elements of example 20 and the method may additionally include: conductively coupling the base die circuitry having the first functionality and the semiconductor die circuitry having the first functionality to a conductive structure disposed on a substrate.

Example 22 may include elements of any of examples 20 or 21 where forming a first plurality of conductors on a first layer of a base die may further include: forming each of the first plurality of conductors orthogonal to at least one of the second plurality of conductors.

Example 23 may include elements of any of claims 20 through 22 and the method may additionally include: forming a third plurality of conductors on a second layer of the base die; and conductively coupling each of the third plurality of conductors to a plurality of nodes not directly conductively coupled by the first plurality of conductors and the second plurality of conductors.

Example 24 may include elements of any of claims 20 through 22 where forming a first plurality of conductors on a first layer of a base die may further include: forming each of the first plurality of conductors orthogonal to each of the second plurality of conductors.

Example 25 may include elements of any of claims 20 through 24 where forming a third plurality of conductors on a second layer of the base may further include: forming each of the third plurality of conductors on the second layer such that each of the third plurality of conductors forms an angle of less than 90° measured with respect to the first plurality of conductors and with respect to the second plurality of conductors.

Example 26 may include elements of any of claims 20 through 25 where forming a first plurality of conductors on a first layer of a base die may further include: forming each of the first plurality of conductors such that each of the first plurality of conductors intersects and conductively couples to each of the second plurality of conductors.

Example 27 may include elements of any of claims 20 through 26 and the method may further include: conductively coupling the first plurality of conductors, the second plurality of conductors, and the third plurality of conductors at respective ones of a portion of the plurality of nodes using an electrically conductive via.

Example 28 may include elements of any of claims 20 through 27 where forming circuitry providing a first functionality in a base die comprises forming circuitry providing input/output (I/O) functionality in the base die.

Example 29 may include elements of any of claims 20 through 28 and the method may further include: conductively coupling at least one IP core die to at least one of the plurality of nodes included in the electrical mesh network.

Example 30 may include elements of any of claims 20 through 29 and the method may additionally include: forming at least one active element in the base die circuitry, the at least one active element formed proximate an upper portion of the base die.

Example 31 may include elements of any of claims 20 through 30 where forming at least one active element in the base die circuitry may further include: forming at least one transistor proximate the upper portion of the base die, the at least one transistor conductively coupled to the electrical mesh network.

Example 32 may include elements of any of claims 20 through 31 and the method may further include: forming at least one active element in the semiconductor die circuitry, the at least one active element formed proximate a lower portion of the respective semiconductor die.

Example 33 may include elements of any of claims 20 through 32 where forming a first plurality of conductors on a first layer of the base die may further include: patterning each of the first plurality of conductors on the upper surface of the base die.

Example 34 may include elements of any of claims 20 through 33 where forming a second plurality of conductors on the first layer of the base die may further include: patterning each of the second plurality of conductors on the upper surface of the base die.

Example 35 may include elements of any of claims 20 through 34 and the method may further include: forming support circuitry in the base die; and conductively coupling the support circuitry to at least one of the plurality of nodes included in the electrical mesh network.

Example 36 may include elements of any of claims 20 through 35 where forming support circuitry in the base die may further include: forming, in the base die, support circuitry that includes at least one of: voltage regulator circuitry, controller circuitry, and memory circuitry.

Example 37 may include elements of any of claims 20 through 36 where forming support circuitry in the base die may further include: forming, in the base die, support circuitry that includes the driver circuitry.

According to example 38, there is provided a processor-based electronic device. The device may include: a printed circuit board; and a semiconductor package conductively coupled to the printed circuit board, the semiconductor package including: an electrical mesh network that includes: a first plurality of conductors; a second plurality of conductors, each of the second plurality of conductors intersecting at least one of the first plurality of conductors to form a plurality of nodes, each of the plurality of nodes at a respective intersection of one of the first plurality of conductors with one of the second plurality of conductors; a base die having an upper surface and a lower surface, the base die including circuitry providing a first functionality conductively coupled to at least one of the plurality of nodes; a plurality of semiconductor dies, at least one of the plurality of semiconductor dies including circuitry providing the first functionality; each of the plurality of semiconductor dies conductively coupled to a respective one of the plurality of nodes; and driver circuitry to selectively conductively couple the electrical mesh network to at least one of the first semiconductor die circuitry providing the first functionality or the at least one second semiconductor die providing the first functionality.

Example 39 may include elements of example 38 where each of the first plurality of conductors is disposed orthogonally to at least one of the second plurality of conductors.

Example 40 may include elements of examples 38 and 39 where each of the first plurality of conductors intersects and conductively couples to each of the second plurality of conductors.

Example 41 may include elements of any of example 38 through 40 where the first functionality comprises a input/output (I/O) functionality and where the base die circuitry providing the I/O functionality and the semiconductor die circuitry providing the I/O functionality conductively couple to a common conductive structure.

Example 42 may include elements of any of example 38 through 41 where at least one of the plurality of semiconductor dies includes processor core circuitry.

Example 43 may include elements of any of example 38 through 42 where the base die may further include voltage regulator circuitry, the voltage regulator circuitry conductively coupled to the processor core circuitry included in at least one of the plurality of second semiconductor dies.

Example 44 may include elements of any of example 38 through 43 where the base die may include a plurality of vias that conductively couple at least one of: the electrical mesh network and the base die circuitry to contact pads disposed on the lower surface of the base die.

Example 45 may include elements of any of example 38 through 44 where the base die circuitry may further include at least one active element.

Example 46 may include elements of any of example 38 through 45 where the at least one active element may include at least one transistor disposed proximate the upper surface of the base die, the at least one transistor conductively coupled to the electrical mesh network.

Example 47 may include elements of any of example 38 through 46 where each of the plurality of semiconductor dies includes an upper surface and a lower surface; and where at least one of the plurality of semiconductor dies includes at least one transistor disposed proximate the lower surface of the respective semiconductor die.

Example 48 may include elements of any of example 38 through 47 where each of the first plurality of conductors may include a plurality of conductors patterned on the upper surface of the base die.

Example 49 may include elements of any of example 38 through 48 where each of the second plurality of conductors may include a plurality of conductors patterned on the upper surface of the base die.

Example 50 may include elements of any of example 38 through 49 where the base die may further include at least one of: voltage regulator circuitry, controller circuitry, and memory circuitry.

Example 51 may include elements of any of example 38 through 50 and the device may further include: a third plurality of conductors conductively coupled to a plurality of nodes not directly conductively coupled by the first plurality of conductors and the second plurality of conductors.

Example 52 may include elements of any of example 38 through 51 where the base die comprises a multi-layered integrated circuit and where the first plurality of conductors and the second plurality of conductors are disposed on a first layer of the multi-layer integrated circuit and the third plurality of conductors is disposed on a second layer of the multi-layer integrated circuit.

Example 53 may include elements of any of example 38 through 52 where an electrically conductive via couples at least one of the third plurality of conductors to a respective one of the plurality of nodes.

Example 54 may include elements of any of example 38 through 53 where each of the first plurality of conductors is disposed orthogonally to each of the second plurality of conductors to provide an orthogonal electrical mesh network.

Example 55 may include elements of any of example 38 through 54 where the third plurality of conductors comprises a plurality of diagonal conductors, each of the plurality of diagonal conductors disposed at an angle of less than 90° measured with respect to the first plurality of conductors and with respect to the second plurality of conductors.

Example 56 may include elements of any of example 38 through 55 and the device may further include: a substrate having at least one conductive structure, the at least one conductive structure communicably coupled to the base die circuitry providing the first functionality and to semiconductor die circuitry providing the first functionality.

According to example 57, there is provided a system. The system may include: means for forming circuitry providing a first functionality in a base die; means for forming a first plurality of conductors on a first layer of the base die; means for forming a second plurality of conductors on the first layer of the base die, where: each of the first plurality of conductors are spaced apart from the remaining first plurality of conductors; each of the second plurality of conductors are spaced apart from the remaining second plurality of conductors; and each of the first plurality of conductors intersects and conductively couples to at least one of the second plurality of conductors to form an electrical mesh network that includes a plurality of nodes, at least a portion of the plurality of nodes conductively coupled the base die circuitry providing the first functionality; means for conductively coupling at least one semiconductor die to a respective one of the portion of the plurality of nodes coupled to the first plurality of conductors and to the second plurality of conductors, the at least one semiconductor die including circuitry providing the first functionality; and means for conductively coupling driver circuitry to the respective one of the portion of the plurality of nodes coupled to the first plurality of conductors and to the second plurality of conductors, the driver circuitry to selectively conductively couple at least the base die circuitry providing the first functionality or the semiconductor die circuitry providing the first functionality to the electrical mesh network.

Example 58 may include elements of example 57, and the system may further include: means for conductively coupling the base die circuitry having the first functionality and the semiconductor die circuitry having the first functionality to a conductive structure disposed on a substrate.

Example 59 may include elements of any of examples 57 and 58 where the means for forming a first plurality of conductors on a first layer of a base die may further include: means for forming each of the first plurality of conductors orthogonal to at least one of the second plurality of conductors.

Example 60 may include elements of any of examples 57 through 59 and the system may further include: means for forming a third plurality of conductors on a second layer of the base die and means for conductively coupling each of the third plurality of conductors to a plurality of nodes not directly conductively coupled by the first plurality of conductors and the second plurality of conductors.

Example 61 may include elements of any of examples 57 through 60 where the means for forming a first plurality of conductors on a first layer of a base die may further include: means for forming each of the first plurality of conductors orthogonal to each of the second plurality of conductors.

Example 62 may include elements of any of examples 57 through 61 where the means for forming a third plurality of conductors on a second layer of the base may further include: means for forming each of the third plurality of conductors on the second layer such that each of the third plurality of conductors forms an angle of less than 90° measured with respect to the first plurality of conductors and with respect to the second plurality of conductors.

Example 63 may include elements of any of examples 57 through 62 where the means for forming a first plurality of conductors on a first layer of a base die may further include: means for forming each of the first plurality of conductors such that each of the first plurality of conductors intersects and conductively couples to each of the second plurality of conductors.

Example 64 may include elements of any of examples 57 through 63 and the system may further include: means for conductively coupling the first plurality of conductors, the second plurality of conductors, and the third plurality of conductors at respective ones of a portion of the plurality of nodes using an electrically conductive via.

Example 65 may include elements of any of examples 57 through 64 where the means for forming circuitry providing a first functionality in a base die may include: means for forming circuitry providing input/output (I/O) functionality in the base die.

Example 66 may include elements of any of examples 57 through 65 and the system may further include: means for conductively coupling at least one IP core die to at least one of the plurality of nodes included in the electrical mesh network.

Example 67 may include elements of any of examples 57 through 66 and the system may further include: means for forming at least one active element in the base die circuitry, the at least one active element formed proximate an upper portion of the base die.

Example 68 may include elements of any of examples 57 through 67 where the means for forming at least one active element in the base die circuitry may further include: means for forming at least one transistor proximate the upper portion of the base die, the at least one transistor conductively coupled to the electrical mesh network.

Example 69 may include elements of any of examples 57 through 68 and the system may further include: means for forming at least one active element in the semiconductor die circuitry, the at least one active element formed proximate a lower portion of the respective semiconductor die.

Example 70 may include elements of any of examples 57 through 69 where the means for forming a first plurality of conductors on a first layer of the base die may further include: means for patterning each of the first plurality of conductors on the upper surface of the base die.

Example 71 may include elements of any of examples 57 through 70 where the means for forming a second plurality of conductors on the first layer of the base die may further include: means for patterning each of the second plurality of conductors on the upper surface of the base die.

Example 72 may include elements of any of examples 57 through 71 and the system may additionally include: means for forming support circuitry in the base die; and means for conductively coupling the support circuitry to at least one of the plurality of nodes included in the electrical mesh network.

Example 73 may include elements of any of examples 57 through 72 where the means for forming support circuitry in the base die may further include: means for forming, in the base die, support circuitry that includes at least one of: voltage regulator circuitry, controller circuitry, and memory circuitry.

Example 74 may include elements of any of examples 57 through 73 where the means for forming support circuitry in the base die may further include: means for forming, in the base die, support circuitry that includes the driver circuitry.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A semiconductor package, comprising:
   an electrical mesh network that includes:
      a first plurality of conductors;
      a second plurality of conductors disposed in the same layer as the first plurality of conductors, each of the second plurality of conductors intersecting at least one of the first plurality of conductors to form a plurality of nodes, each of the plurality of nodes at a respective intersection of one of the first plurality of conductors with one of the second plurality of conductors;
   a base die having an upper surface and a lower surface, the base die including circuitry providing a first functionality conductively coupled to at least one of the plurality of node, and the base die having a footprint;
   a plurality of semiconductor dies, at least one of the plurality of semiconductor dies including circuitry providing the first functionality;
   each of the plurality of semiconductor dies conductively coupled to a respective one of the plurality of nodes, wherein the plurality of semiconductor dies is above and within the footprint of the base die; and
   driver circuitry to selectively conductively couple the electrical mesh network to at least one of the base die circuitry providing the first functionality or the at least one of the plurality of semiconductor dies providing the first functionality.

2. The semiconductor package of claim 1 wherein each of the first plurality of conductors is disposed orthogonally to at least one of the second plurality of conductors.

3. The semiconductor package of claim 1 wherein each of the first plurality of conductors intersects and conductively couples to each of the second plurality of conductors.

4. The semiconductor package of claim 1:
   wherein the first functionality comprises a input/output (I/O) functionality;
      wherein the base die circuitry providing the I/O functionality and the semiconductor die circuitry providing the I/O functionality conductively couple to a common conductive structure.

5. The semiconductor package of claim 1 wherein the base die circuitry further includes at least one active element.

6. The semiconductor package of claim 5 wherein the at least one active element comprises at least one transistor disposed proximate the upper surface of the base die, the at least one transistor conductively coupled to the electrical mesh network.

7. The semiconductor package of claim 1:
   wherein each of the plurality of semiconductor dies includes an upper surface and a lower surface; and
   wherein at least one of the plurality of semiconductor dies includes at least one transistor disposed proximate the lower surface of the respective semiconductor die.

8. The semiconductor package of claim 1:
   wherein each of the first plurality of conductors comprises a plurality of conductors patterned on the upper surface of the base die; and
   wherein each of the second plurality of conductors comprises a plurality of conductors patterned on the upper surface of the base die.

9. The semiconductor package of claim 1, further comprising:
   a third plurality of conductors conductively coupled to a plurality of nodes not directly conductively coupled by the first plurality of conductors and the second plurality of conductors.

10. The semiconductor package of claim 9:
    wherein the base die comprises a multi-layered integrated circuit;
    wherein the first plurality of conductors and the second plurality of conductors are disposed on a first layer of the multi-layer integrated circuit and the third plurality of conductors is disposed on a second layer of the multi-layer integrated circuit.

11. The semiconductor package of claim 9 wherein each of the first plurality of conductors is disposed orthogonally to each of the second plurality of conductors to provide an orthogonal electrical mesh network.

12. The semiconductor package of claim 11 wherein the third plurality of conductors comprises a plurality of diagonal conductors, each of the plurality of diagonal conductors disposed at an angle of less than 90° measured with respect to the first plurality of conductors and with respect to the second plurality of conductors.

13. The semiconductor package of claim 1, further comprising:
    a substrate having at least one conductive structure, the at least one conductive structure communicably coupled to the base die circuitry providing the first functionality and to semiconductor die circuitry providing the first functionality.

14. An processor-based electronic device, comprising:
    a printed circuit board; and
    a semiconductor package conductively coupled to the printed circuit board, the semiconductor package including:
       an electrical mesh network that includes:
          a first plurality of conductors;
          a second plurality of conductors disposed in the same layer as the first plurality of conductors, each of the second plurality of conductors intersecting at least one of the first plurality of conductors to form a plurality of nodes, each of the plurality of nodes at a respective intersection of one of the first plurality of conductors with one of the second plurality of conductors;
       a base die having an upper surface and a lower surface, the base die including circuitry providing a first functionality conductively coupled to at least one of the plurality of nodes, and the base die having a footprint;
       a plurality of semiconductor dies, at least one of the plurality of semiconductor dies including circuitry providing the first functionality; each of the plurality of semiconductor dies conductively coupled to a respective one of the plurality of nodes, wherein the plurality of semiconductor dies is above and within the footprint of the base die; and
       driver circuitry to selectively conductively couple the electrical mesh network to at least one of the base die circuitry providing the first functionality or the at least one of the plurality of semiconductor dies providing the first functionality.

15. The processor-based electronic device of claim 14:
wherein the first functionality comprises a input/output (I/O) functionality;
  wherein the base die circuitry providing the I/O functionality and the semiconductor die circuitry providing the I/O functionality conductively couple to a common conductive structure.

16. The processor-based electronic device of claim 14, further comprising:
  a third plurality of conductors conductively coupled to a plurality of nodes not directly conductively coupled by the first plurality of conductors and the second plurality of conductors.

* * * * *